United States Patent
Nagasaka et al.

(10) Patent No.: US 7,924,402 B2
(45) Date of Patent: Apr. 12, 2011

(54) EXPOSURE APPARATUS AND DEVICE MANUFACTURING METHOD

(75) Inventors: Hiroyuki Nagasaka, Kumagaya (JP); Taro Yamamoto, Koshi (JP); Osamu Hirakawa, Koshi (JP)

(73) Assignees: Nikon Corporation, Tokyo (JP); Tokyo Electron Limited, Tokyo (JP)

( * ) Notice: Subject to any disclaimer, the term of this patent is extended or adjusted under 35 U.S.C. 154(b) by 999 days.

(21) Appl. No.: 11/374,953

(22) Filed: Mar. 15, 2006

(65) Prior Publication Data
US 2006/0231206 A1    Oct. 19, 2006

Related U.S. Application Data

(63) Continuation of application No. PCT/JP2004/014000, filed on Sep. 16, 2004.

(30) Foreign Application Priority Data

Sep. 19, 2003  (JP) ................... P2003-328997

(51) Int. Cl.
*G03B 27/68* (2006.01)
*G03B 27/52* (2006.01)
*G03B 27/42* (2006.01)
*G03B 27/54* (2006.01)
*G03B 27/58* (2006.01)

(52) U.S. Cl. ............... 355/52; 355/30; 355/53; 355/55; 355/67; 355/72

(58) Field of Classification Search .............. 355/53, 355/30, 52, 55, 77, 67–76; 250/492.1, 492.2, 250/492.22, 548; 430/8, 30, 311; 359/656, 359/657, 820, 819

See application file for complete search history.

(56) References Cited

U.S. PATENT DOCUMENTS

| 4,346,164 | A | 8/1982 | Tabarelli et al. |
| 4,480,910 | A | 11/1984 | Takanashi et al. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |

(Continued)

FOREIGN PATENT DOCUMENTS

DE    221 563 A1    4/1985

(Continued)

OTHER PUBLICATIONS

English translation of JP2004-053955, which is a publication of W02004/053955, published Jun. 24, 2004.*

(Continued)

*Primary Examiner* — Peter B Kim
*Assistant Examiner* — Christina Riddle
(74) *Attorney, Agent, or Firm* — Oliff & Berridge, PLC

(57) ABSTRACT

An exposure apparatus exposes a substrate by projecting a pattern image onto the substrate via a projection optical system and a liquid. The exposure apparatus includes a liquid supply device which supplies liquid onto the substrate from above the substrate through a first and second supply ports disposed in a vicinity of a projection area onto which the pattern image is projected, and a liquid recovery device which recovers liquid on the substrate from above the substrate through an inside recovery port disposed outside the first and second supply ports and an outside the second recovery port disposed outside the inside recovery port.

5 Claims, 15 Drawing Sheets

U.S. PATENT DOCUMENTS

| | | | |
|---|---|---|---|
| 5,874,820 A | 2/1999 | Lee | |
| 5,969,441 A | 10/1999 | Loopstra et al. | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 2001/0019399 A1* | 9/2001 | Hagiwara | 355/30 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0103950 A1* | 6/2004 | Iriguchi | 141/2 |
| 2004/0109237 A1 | 6/2004 | Epple et al. | |
| 2004/0114117 A1 | 6/2004 | Bleeker et al. | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derkson et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1* | 12/2004 | Nakano | 355/30 |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1* | 1/2005 | Mulkens et al. | 355/30 |
| 2005/0024609 A1 | 2/2005 | De Smit et al. | |
| 2005/0030497 A1* | 2/2005 | Nakamura | 355/30 |
| 2005/0030498 A1 | 2/2005 | Mulkens | |
| 2005/0030506 A1 | 2/2005 | Schuster | |
| 2005/0030511 A1 | 2/2005 | Auer-Jongepier et al. | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0078286 A1 | 4/2005 | Dierichs et al. | |
| 2005/0078287 A1 | 4/2005 | Sengers et al. | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1* | 6/2005 | Mulkens et al. | 101/463.1 |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219488 A1* | 10/2005 | Nei et al. | 355/53 |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesnychenko et al. | |
| 2005/0233081 A1* | 10/2005 | Tokita | 427/256 |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0259234 A1 | 11/2005 | Hirukawa et al. | |
| 2005/0264774 A1* | 12/2005 | Mizutani et al. | 355/30 |
| 2005/0264778 A1 | 12/2005 | Lof et al. | |
| 2005/0270505 A1 | 12/2005 | Smith | |
| 2005/0280791 A1 | 12/2005 | Nagasaka et al. | |
| 2007/0109517 A1* | 5/2007 | Takaiwa et al. | 355/53 |

FOREIGN PATENT DOCUMENTS

| | | |
|---|---|---|
| DE | 224 448 A1 | 7/1985 |
| JP | A 57-153433 | 9/1982 |
| JP | A-58-202448 | 11/1983 |
| JP | A-59-019912 | 2/1984 |
| JP | A-62-065326 | 3/1987 |
| JP | A-63-157419 | 6/1988 |
| JP | A-04-305915 | 10/1992 |
| JP | A-04-305917 | 10/1992 |
| JP | A-05-062877 | 3/1993 |
| JP | A-06-124873 | 5/1994 |
| JP | A-07-220990 | 8/1995 |
| JP | A-08-166475 | 6/1996 |
| JP | A-08-316125 | 11/1996 |
| JP | A-08-330224 | 12/1996 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-176727 | 7/1999 |
| JP | A-2000-058436 | 2/2000 |
| JP | A-2000-505958 | 5/2000 |
| JP | A-2004-020711 | 1/2004 |
| JP | A-2004-259966 | 9/2004 |
| JP | A-2004-349645 | 12/2004 |
| WO | WO 99/49504 A1 | 9/1999 |
| WO | WO 02/091078 A1 | 11/2002 |
| WO | WO 03/077037 A1 | 9/2003 |
| WO | WO 2004/095135 A2 | 11/2003 |
| WO | WO 2004/019128 A2 | 3/2004 |
| WO | WO 2004/053956 A1 | 6/2004 |
| WO | WO 2004053953 A1 * | 6/2004 |
| WO | WO 2004053955 A1 * | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |

| | | |
|---|---|---|
| WO | WO 2004/093159 A2 | 10/2004 |
| WO | WO 2004/093160 A2 | 10/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A1 | 6/2005 |
| WO | WO 2005/059654 A1 | 6/2005 |
| WO | WO 2005/062128 A1 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Lin, B.J. "Semiconductor Foundry, Lithography, and Partners." Proceedings of SPIE, vol. 4688, pp. 11-24, 2002.

Switkes, M., et al. "Resolution Enhancement of 157nm Lithography by Liquid Immersion." Proceedings of SPIE, vol. 4691, pp. 459-465, 2002.

Switkes, M., et al. "Resolution Enhancement of 157nm Lithography by Liquid Immersion." J. Microlith., Microfab., Microsyst., vol. 1, No. 3, pp. 1-4, 2002.

Owa, Soichi, et al. "Nikon F2 Exposure Tool," slides 1-25, $3^{rd}$ 157nm Symposium, Sep. 4, 2002.

Owa, Soichi. "Immersion Lithography," slides 1-24, Immersion Lithography Workshop, Dec. 11, 2002.

Owa, Soichi, et al. "Immersion Lithography; its Potential Performance and Issues." Proceedings of SPIE, vol. 5040, pp. 724-733, 2003.

Owa, Soichi, et al. "Potential Performance and Feasibility of Immersion Lithography," slides 1-33, NGL Workshop 2003, Jul. 2003.

Owa, Soichi, et al. "Update on 193nm Immersion Exposure Tool," slides 1-38, Immersion Workshop 2004, Jan. 27, 2004.

Owa, Soichi, et al. "Update on 193nm Immersion Exposure Tool," slides 1-51, Litho Forum, Jan. 28, 2004.

* cited by examiner

EXPOSURE APPARATUS AND DEVICE MANUFACTURING METHOD

CROSS-REFERENCE TO RELATED APPLICATIONS

This is a Continuation of International Application No. PCT/JP2004/014000 filed Sep. 16, 2004, which claims the benefit of Japanese Patent Application No. 2003-328997 filed Sep. 19, 2003. The entire disclosure of the prior applications is hereby incorporated by reference herein in its entirety.

BACKGROUND OF THE INVENTION

1. Field of the Invention

The present invention relates to an exposure apparatus and a device manufacturing method which performs exposure by irradiating a substrate with exposure light via a projection optical system and liquid.

2. Description of Related Art

Semiconductor devices and liquid crystal displaying devices are manufactured by transferring a pattern formed on a mask onto a photosensitive substrate, in other words, through a photolithography technique. An exposure apparatus which is used in the photolithography processing, includes a mask stage which holds a mask, and a substrate stage which holds a substrate. The exposure apparatus transfers the mask pattern onto the substrate via a projection optical system, while successively moving the mask stage and the substrate stage.

Recently, in order to realize higher integration of the device pattern, there has been demand for higher resolution of the projection optical system. When the exposure wavelength to be used is shorter, the resolution of the projection optical system becomes higher. When the numerical aperture of the projection optical system is larger, the resolution of the projection optical system becomes higher. Consequently, the exposure wavelength used in the exposure apparatus has shortened as years go by, and the numerical apertures of projection optical systems have also increased. Further, the currently mainstream exposure wavelength is the 248 nm of an KrF excimer laser, but an even shorter wavelength 193 nm ArF excimer laser is also being commercialized In addition, in addition to resolution, the depth of focus (DOF) is important when exposure is performed. The resolution R and the depth of focus δ are respectively given by the following formulas.

$$R = k_1 \cdot \lambda / NA \quad (1)$$

$$\Delta = \pm k_2 \cdot \lambda / NA^2 \quad (2)$$

It is note that λ is the exposure wavelength, NA is the numerical aperture of the projection optical system, and $k_1$, $k_2$ are process coefficients. According to formula (1) and formula (2), in order to increase the resolution R, if the exposure wavelength is shortened and the numerical aperture NA increases, it is known that the depth of focus δ becomes narrower.

If the depth of focus δ becomes too narrow, it becomes difficult to make the substrate surface coincide with the image plane of the projection optical system, and thus there occurs the possibility that the focus margin during the exposure operation will be insufficient. As a method for essentially shortening the exposure wavelength and expanding the depth of focus, for example, in International Publication No. WO 99/49504, a liquid immersion method is disclosed. This liquid immersion method is designed to, by filling the space between a lower surface of the projection optical system and the substrate surface with liquid such as water, organic solvent or the like, form a liquid immersion area and by taking advantage of the fact that the wavelength of the exposure light in the liquid becomes 1/n times (n is the refractive index of the liquid, and is normally about 1.2 to 1.6) of that in the air, improve resolution and, at the same time, extend the depth of focus by approximately n times.

Now, in order to maintain exposure accuracy in the exposing process following the liquid immersion method, and to prevent deterioration of the pattern exposed onto the substrate, it is important to supply and recovery the liquid smoothly.

Specially, if the liquid cannot be recovered smoothly, the remaining liquid which cannot be recovered flows out, and surrounding mechanical parts rust. Further, the environment around the substrate (humidity, etc.) changes, and thus the refractive index on an optical path of a detection light of a light interferometer used to measure the position of the stage changes. Therefore, various measuring operations relative to the exposing process may be affected. As a result, exposure accuracy is lowered.

In addition, if a liquid supply device and/or a recovery device vibrate, the pattern image projected onto the substrate may deteriorate due to the vibration, and a measuring error of the interferometer which monitors the position of the substrate stage holding the substrate may be caused. The present invention was made by taking such circumstances into consideration, and has as an object to provide an exposure apparatus and a device manufacturing method, which can maintain exposure accuracy in an exposing process which is performed by irradiating a substrate with exposure light via a projection optical system and a liquid.

SUMMARY OF THE INVENTION

The present invention provides an exposure apparatus which exposes a substrate by projecting a pattern image onto the substrate via a projection optical system and a liquid, including: a liquid supply device which has a supply port disposed in the vicinity of a projection area onto which the pattern image is projected, and which supplies the liquid onto the substrate from above the substrate through the supply port; and a liquid recovery device which has a first recovery port disposed further from the projection area than the supply port and a second recovery port disposed still further from the projection area than the first recovery port, and which recovers the liquid on the substrate from above the substrate through the first recovery port and the second recovery port.

In accordance with the present invention, since the first recovery port is disposed further from the projection area than the supply port, and the second recovery port is disposed further from the projection area than the first recovery port, even if all of the liquid on the substrate cannot be recovered through the first recovery port, it is possible to recover the remaining liquid which cannot be recovered through the first recovery port, through the second recovery port. Therefore, it is possible to prevent exposure accuracy from deteriorating due to flowing out of the liquid.

The present invention provides an exposure apparatus which exposes a substrate by projecting a pattern image onto the substrate via a projection optical system and a liquid, including a liquid recovery device which has a recovery port disposed above the substrate, and which recovers the liquid on the substrate from above the substrate through the recovery port, wherein a porous member is disposed inside the recovery port.

In accordance with the present invention, since the porous member is disposed inside the recovery port, it is possible to prevent the occurrence of loud noise and vibration when the liquid on the substrate is recovered. Therefore, it is possible to prevent exposure accuracy from deteriorating due to the vibration or the like.

The present invention provides an exposure apparatus which exposes a substrate by projecting a pattern image onto the substrate via a projection optical system and a liquid, including a liquid recovery device which has a recovery port disposed above the substrate, and which recovers the liquid on the substrate from above the substrate through the recovery port, wherein a capillary tube member is disposed inside the recovery port.

In accordance with the present invention, since the capillary tube member is disposed inside the recovery port of the liquid recovery device, it is possible to prevent loud noise and vibration from occurring when the liquid on the substrate is recovered. Therefore, it is possible to prevent exposure accuracy from deteriorating due to the vibration or the like.

The present invention provides an exposure apparatus which exposes a substrate by projecting a pattern image onto the substrate via a projection optical system and a liquid, including: a liquid supply device which has a supply port disposed in the vicinity of a projection area onto which the pattern image is projected, and which supplies the liquid onto the substrate from above the substrate through the supply port; a liquid recovery device which has a recovery port disposed so as to surround the projection area and the supply port, and which recovers the liquid on the substrate from above the substrate through the recovery port; and a control system which controls at least one of the quantity of the liquid supplied through the supply port and the quantity of the liquid recovered through the recovery port, so that only the liquid is recovered through the recovery port.

In accordance with the present invention, since at least one of the quantity of the liquid supplied onto the substrate and the quantity of the liquid recovered from above the substrate is controlled, it is possible to recover only the liquid through the recovery port, and it is possible to prevent the occurrence of noise and vibration. Therefore, it is possible to prevent exposure accuracy from deteriorating due to the vibration or the like.

The present invention provides an exposure apparatus which forms a liquid immersion area at one part of the top of a substrate, and which exposes the substrate by irradiating the substrate with exposure light via a liquid which forms the liquid immersion area and a projection optical system, including a detecting device which detects an end portion of the liquid immersion area.

In accordance with the present invention, since the end portion of the liquid immersion area is detected, and then, for example, the quantity of the liquid supplied and/or the quantity of the liquid recovered are controlled based on the detection, it is possible to prevent spreading of the liquid immersion area and flowing out of the liquid.

The present invention provides a device manufacturing method using the exposure apparatus described above.

In accordance with the present invention, it is possible to perform exposing while maintaining exposure accuracy high.

BRIEF DESCRIPTION OF THE DRAWINGS

FIG. 5B is perspective view of the third member which forms the passage forming member viewed from below.

DESCRIPTION OF THE PREFERRED EMBODIMENTS

The following explains a first embodiment of an exposure apparatus of the present invention referring to the figures.

Figure 1:
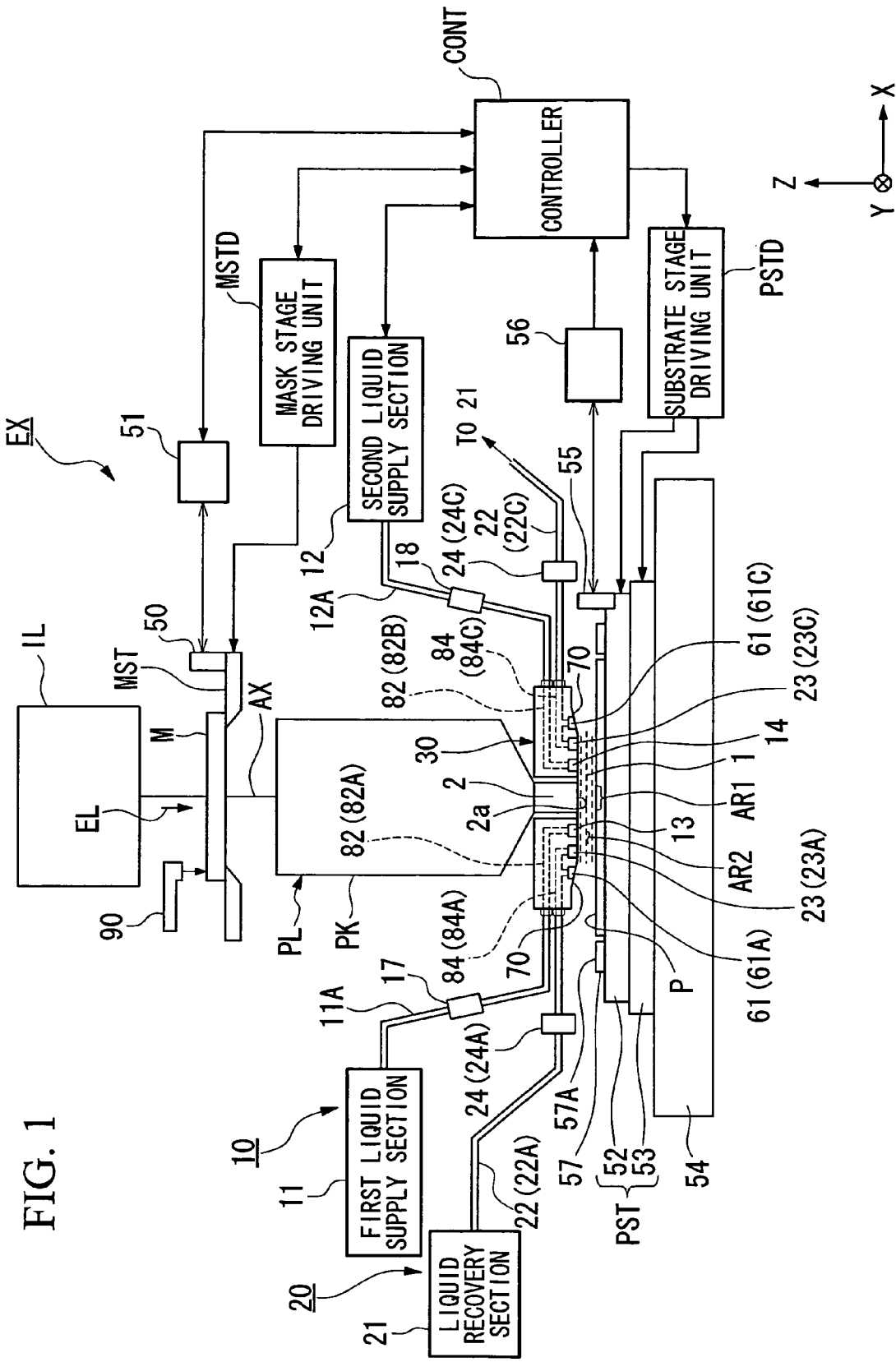
FIG. 1 is general arrangement diagram showing a first embodiment of an exposure apparatus of the present invention.

FIG. 1 is a general arrangement diagram showing the exposure apparatus of this embodiment. In FIG. 1, the exposure apparatus EX includes: a mask stage MST which holds a mask M; a substrate stage PST which holds a substrate P; an illumination optical system IL which illuminates the mask M held on the mask stage MST with exposure light EL; a projection optical system PL which projection-exposes a pattern image of the mask M illuminated by the exposure light onto the substrate P held on the substrate stage PST; and a controller CONT which collectively controls overall operations of the exposure apparatus EX.

The exposure apparatus EX of this embodiment is a liquid immersion exposure apparatus applying a liquid immersion method, in order to increase resolution by actually shortening the exposure wavelength, and to actually increase the depth of focus. This exposure apparatus EX includes: a liquid supply device 10 which supplies a liquid 1 onto the substrate P; and a liquid recovery device 20 which recovers the liquid 1 supplied on the substrate P. In the exposure apparatus EX, at least while the pattern image of the mask M is transferred onto the substrate P, by the liquid 1 supplied from the liquid supply device 10, a liquid immersion area AR2 is (locally) formed at one part of the top of the substrate P which includes a projection area AR1 of the projection optical system PL. Specially, the exposure apparatus EX applies a local liquid immersion method in which the liquid 1 is provided between an optical element 2 disposed on an end portion of an image plane side of the projection optical system PL and the surface of the substrate P disposed on the image plane side. In the exposure apparatus EX, the pattern of the mask M is projection-exposed onto the substrate P by irradiating the substrate P with the exposure light EL which passed through the mask M, through the projection optical system PL and the liquid 1 with which an optical path space between the projection optical system PL and the substrate P is filled.

The embodiment will be explained as exemplified by a case of the use of scanning type exposure apparatus (so-called scanning stepper) as the exposure apparatus EX in which the substrate P is exposed with the pattern formed on the mask M while synchronously moving the mask M and the substrate P in mutually different directions (opposite directions) along the scanning direction. In the following description, it is assumed that the direction that coincides with the optical axis AX of the projection optical system PL is referred to as the Z-axis direction, that the synchronous movement direction (scanning direction), in a plane perpendicular to the Z-axis direction, of the mask M and the substrate P is referred to as the X-axis direction, and that the direction (non-scanning direction) perpendicular to the Z-axis direction and to the X-axis direction is referred to as the Y-axis direction. Further, it is assumed that the rotation (inclination) directions around the X-axis, Y-axis, and Z-axis are respectively referred to as the θX-direction, the θY-direction, and the θZ-direction. It is note that the "substrate" referred to herein includes a semiconductor wafer over which a photoresist, a photosensitive material, is coated and that the "mask" includes a reticle formed with a device pattern to be reduction-projected onto a substrate.

The illumination optical system IL illuminates the mask M held on the mask stage MST with the exposure light EL, and includes an exposure light source, an optical integrator which makes uniform the illumination of light beams emitted from the exposure light source, a condenser lens which condenses the exposure light EL from the optical integrator, a relay lens system, a variable field stop which sets an illumination area on the mask M formed by the exposure light EL to be of a slit-like shape, and the like. A predetermined illumination area on the mask M is illuminated, by the illumination optical system IL, with the exposure light EL having a uniform illuminance distribution. As the exposure light EL emitted from the illumination optical system IL, for example, bright rays of the ultraviolet region (g-rays, h-rays, i-rays) emitted from a mercury lamp, a deep ultraviolet light (DUV light) such as a KrF excimer laser light (wavelength of 248 nm), or a vacuum ultraviolet light (VUV light) such as an ArF excimer laser light (wavelength of 193 nm) or an $F_2$ laser light (wavelength of 157 nm) may be used. In this embodiment, ArF excimer laser light is used.

The mask stage MST holds the mask M, and is two-dimensionally movable and finely rotatable in the θZ-direction, in a plane perpendicular to the optical axis AX of the projection optical system PL, that is, in the XY-plane. The mask MST is driven by a mask stage driving unit MSTD such as a linear motor. The mask stage driving unit MSTD is controlled by the controller CONT. The mask stage MST is provided with a moving mirror 50. Further, a laser interferometer 51 is disposed at a position facing the moving mirror 50. The two-dimensional position and the rotation angle of the mask M held on the mask stage MST are measured by the laser interferometer 51 in real time, and the measurement results are outputted to the controller CONT. By driving the mask stage driving unit MSTD based on the measurement results from the laser interferometer 51, the controller CONT performs positioning of the mask M held on the mask stage MST.

The projection optical system PL projection-exposes the pattern of the mask M onto the substrate P at a predetermined projection magnification of p. The projection optical system PL is constituted by a plurality of optical elements including an optical element (lens) 2 disposed at an end portion on the substrate P side (the image plane side of the projection optical system PL), and the optical elements are supported by a lens barrel PK. In this embodiment, the projection optical system PL is a reduction system of which the projection magnification β is, for example, ¼ or ⅕. It is note that the projection optical system PL may also be either a 1× magnification system or a magnifying system. Further, the optical element (lens) 2 at the end portion of the projection optical system PL of this embodiment is detachable (exchangeable) relative to the lens barrel PK, and the liquid 1 of the liquid immersion area AR2 contacts the optical element 2.

In the embodiment, purified water is used as the liquid 1. The purified water can transmit not only ArF excimer laser light, but also bright rays of ultraviolet region (g-rays, h-rays, or i-rays) emitted from a mercury lamp or deep ultraviolet light (DUV light) such as KrF excimer laser light (wavelength of 248 nm). In this embodiment, the numerical aperture of the projection optical system using purified water for liquid immersion exposure is set at 1 or higher (approximately 1.0 to 1.2).

The optical element 2 is made of fluorite. Since the surface of fluorite, or the surface coated with $MgF_2$, $Al_2O_3$, $SiO_2$ or the like has s high affinity for water. It is possible to bring approximately all of the liquid contact surface 2a of the optical element 2 into contact with the liquid 1. That is, in this embodiment, since a liquid (water) 1 having high affinity with the liquid contact surface 2a of the optical element 2 is supplied, the liquid contact surface 2a of the optical element 2 comes into tightly contact with the liquid 1. Therefore, it is possible to fill the optical path between the optical element 2 and the substrate P with the liquid 1. It is note that the optical element 2 may be quartz, which has a high affinity for water. Further, higher affinity with the liquid 1 may be given to the liquid contact surface 2a of the optical element 2 by hydrophilic (lyophilic) processing the liquid contact surface 2a.

The substrate stage PST holds the substrate P, and includes a Z stage 52 on which the substrate P is held by means of a substrate holder, an XY stage 53 which supports the Z stage 52, and a base 54 which supports the XY stage 53. The substrate stage PST is driven by a substrate stage driving unit PSTD such as a linear motor. The substrate stage driving unit PSTD is controlled by the controller CONT. By driving the Z stage 52, the Z-direction position (focus position) and the θX-direction and θY-direction positions of the substrate P held by the Z stage 52 are controlled. Further, by driving the XY stage 53, the XY-direction position (the position in the direction substantially parallel to the image plane of the projection optical system PL) of the substrate P is controlled. That is, the Z stage 52, by controlling the focus position and inclination angle of the substrate P, makes the surface of the substrate P coincide with the image plane of the projection optical system PL in an auto-focus manner and an auto-leveling manner, and the XY stage 53 performs positioning of the substrate P in the X-axis and Y-axis directions. It is note that the Z stage and the XY stage may be integrally constructed.

A moving mirror 55 is disposed on the substrate stage PST (Z stage 52). Further, a laser interferometer 56 is positioned at a position facing the moving mirror 55. The two-dimensional position and the rotation angle of the substrate P held on the substrate stage PST are measured by the laser interferometer 56 in real time, and the measurement results are outputted to the controller CONT. By driving the substrate stage driving unit PSTD based on the measurement results from the laser interferometer 56, the controller CONT performs positioning of the substrate P held on the substrate stage PST.

Further, a circular plate portion 57 is disposed on the substrate stage PST (Z stage 52) so as to surround the substrate P. The plate portion 57 has a flat surface 57A of which the height is substantially equal to that of a top surface of the substrate P held on the substrate holder. There is a gap of approximately 0.1 to 1 mm between an edge of the substrate P and the plate portion 57. However, the liquid 1 does not flow into the gap due to surface tension of the liquid 1. Therefore, when a vicinity of the circumferential edge of the substrate P is exposed, it is possible to keep the liquid 1 under the projection optical system PL, using the plate portion 57.

The liquid supply device 10 supplies the predetermined liquid 1 onto the substrate P, and includes: a first liquid supply section 11 and a second liquid supply section 12 which can discharge the liquid 1; and a first supply tube 11A and a second supply tube 12A of which end portions are respectively connected to the first and second liquid supply sections 11 and 12. Each of the first and second liquid supply sections 11 and 12 includes a tank storing the liquid 1, a pressure pump and the like.

A flow meter 17 which measures the quantity of liquid discharged from the first liquid supply section 11 and flowing through the first supply tube 12A per unit of time is disposed on the first supply tube 12A. A flow meter 18 which measures the quantity of liquid discharged from the second liquid supply section 12 and flowing through the second supply tube 12B per unit of time is disposed on the second supply tube 12B. The measurement results of the flow meters 17 and 18 are outputted to the controller CONT. The controller CONT can calculate the quantity (quantity of liquid supplied per unit of time) of liquid supplied onto the substrate P by the first and second liquid supply sections 11 and 12, based on the measurement results of the flow meters 17 and 18.

The liquid recovery device 20 recovers the liquid 1 on the substrate P, and includes a liquid recovery section 21 which can recover the liquid 1 and recovery tubes 22 (first to fourth recovery tubes 22A-22D) of which end portions are connected to the liquid recovery section 21. The liquid recovery section 21 includes, for example, a vacuum system (suction apparatus) such as a vacuum pump, a storing tank of the liquid 1 recovered, and the like. It is note that it is not necessary for the exposure apparatus EX to include the tank and the pressure pump of the liquid supply sections 11 and 12, and the vacuum system and the tank of the liquid recovery section 21, but facilities of a factory in which the exposure apparatus EX is provided may be used.

A passage forming member 30 is disposed in the vicinity of the optical element 2 at the end portion of the projection optical system PL. The passage forming member 30 is a circular member disposed above the substrate P (substrate stage PST) so as to surround the optical element 2. The passage forming member 30 includes a first supply port 13 and a second supply port 14 which are disposed above the substrate P (substrate stage PST), and which are arranged facing the surface of the substrate P. Further, the passage forming member 30 is provided with supply passages 82 (82A, 82B) therein. One end portion of the supply passage 82A is connected to the first liquid supply port 13, the other end portion is connected to the first liquid supply section 11 by way of the first supply tube 11A. One end portion of the supply passage 82B is connected to the second liquid supply port 14, the other end portion is connected to the second liquid supply section 12 by way of the second supply tube 12A. Furthermore, the passage forming member 30 includes an inside recovery port (first recovery port) 23 and an outside recovery port (second recovery port) 61 which are disposed above the substrate P (substrate stage PST), and which are arranged facing the surface of the substrate P. In this embodiment, the inside recovery port 23 is composed of four inside recovery ports 23A-23D which are respectively formed like an arc, and which are arranged so as to make a circle. Further, the outside recovery port 61 is composed of four outside recovery ports 61A-61D which are respectively formed like an arc, and which are arranged so as to make a circle. The inside recovery port 23 is arranged so as to surround the optical element 2, and the outside recovery port 61 is arranged outside the inside recovery port 23, so as to be concentric with the inside recovery port 23.

The passage forming member 30 is provided with recovery passages 84 (84A-84D) corresponding to the inside recovery ports 23 (23A-23D) therein. End portions of the supply passages 84A-84D are respectively connected to the recovery ports 23A-23D, and other end portions thereof are respectively connected to the liquid recovery section 21 through the recovery tubes 22A-22D. Further, each of the outside recovery ports 61 (61A-61D) is respectively connected at a point along one of the recovery passages 84 (84A-84D). In this embodiment, the passage forming member 30 constitutes one part of the liquid supply device 10 and one part of the liquid recovery device 20.

It is note that, in this embodiment, the first to fourth recovery tubes 22A-22D are connected to the liquid recovery section 21. However, a plurality (herein, four) of the liquid recovery sections 21 may prepared corresponding to the number of the recovery passages, and the first to fourth recovery tubes 22A-22D may be respectively connected to ones of the plurality of the liquid recovery sections 21.

Flow meters 24A-24D which measure the quantity of liquid flowing through each of the first to fourth recovery tubes 22A-22D per unit of time are respectively disposed on the first to fourth recovery tubes 22A-22D. The measurement results of the flow meters 24A-24D are outputted to the controller CONT. The controller CONT can calculate the quantity (quantity of liquid recovered per unit of time) of liquid recovered from above the substrate P by the liquid recovery section 21, based on the measurement results of the flow meters 24A-24D. It is note that when the liquid 1 on the substrate P is recovered through the recovery ports 23 and 61, if surrounding gas is recovered with the liquid, the recovery tubes 22 between the recovery port 23 (61) and the flow meter 24 are respectively provided with gas-liquid separators, and only liquid separated by the gas-liquid separators may be supplied to each of the flow meters 24. Therefore, the quantity of liquid recovered can be accurately measured.

Liquid supply operations of the first and second liquid supply sections 11 and 12 are controlled by the controller CONT. The controller CONT can independently control the quantity of liquid supplied onto the substrate P by the first liquid supply section 11 per unit of time and the quantity of liquid supplied onto the substrate P by the second liquid supply section 12 per unit of time. The liquid 1 discharged from the first liquid supply section 11 is supplied onto the substrate P from the first supply port 13 disposed above the substrate P, through the supply tube 11A and the supply passage 82A of the passage forming member 30. The liquid 1 discharged from the second liquid supply section 12 is supplied onto the substrate P from the second supply port 14 disposed above the substrate P, through the supply tube 12A and the supply passage 82B of the passage forming member 30.

Further, the liquid recovery operation of the liquid recovery section 21 is controlled by the controller CONT. The controller CONT can control the quantity of liquid recovered by the liquid recovery section 21 per unit of time. The liquid 1 recovered through the recovery ports 23 and 61 disposed above the substrate P is recovered by the liquid recovery section 21 through the recovery passages 84 of the passage forming member 30 and the recovery tubes 22.

On a lower surface (on a surface facing the substrate P side) of the passage forming member 30, a liquid trap surface 70 having predetermined length which captures the liquid 1 is formed so as to be positioned outside the recovery port 61. The liquid trap surface 70 is an inclined surface relative to the XY plane, and is inclined (upwardly) so as to become further away from the surface of the substrate P the further it is from the projection area AR1 (the liquid immersion area AR2). Since a coating (photoresist, reflection prevention coating, protection coating, or the like) applied to the substrate P is normally water-repellent (liquid-repellent), the liquid 1 which flows out to the outside of the recovery ports 61 is captured by the trap surface 70. It is note that, since the liquid 1 of this embodiment is water having high polarity, as hydrophilic processing (lyophilic processing) for the trap surface 70, the trap surface 70 may be made hydrophilic, by forming a thin film made from a material having a highly-polar molecular structure such as alcohol. That is, in a case where water is used as the liquid 1, a material having a highly-polar molecular structure such as hydroxyl groups may be added to the trap surface 70.

Figure 2:
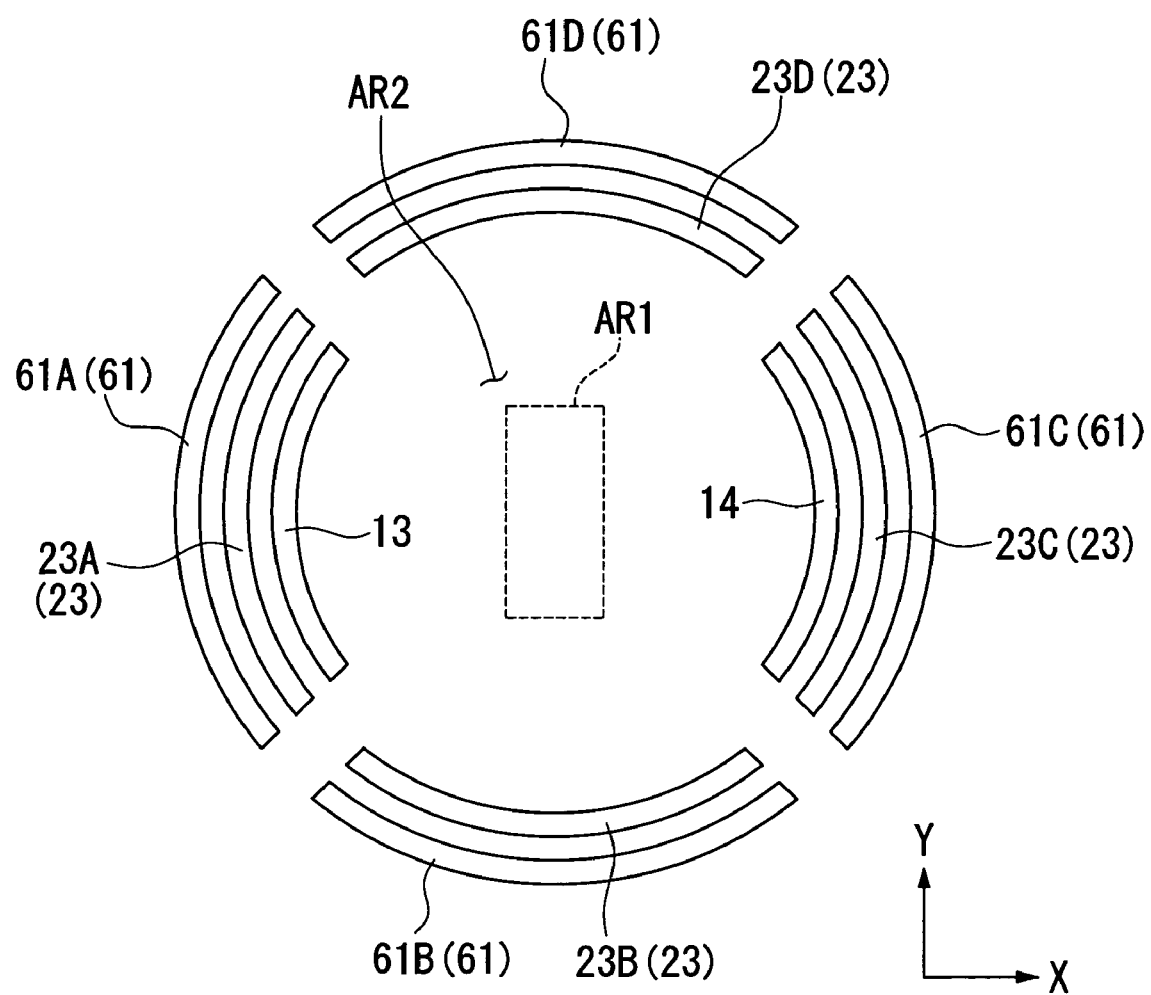
FIG. 2 is plan view for explaining a disposition of liquid supply ports and liquid recovery ports.

FIG. 2 is a plan view showing the positional relationship of the first and second supply ports 13 and 14, the inside recovery ports 23A-23D and the outside recovery ports 61A-61D formed in the passage forming member 30, and the projection area AR1 of the projection optical system PL. In FIG. 2, the projection area AR1 of the projection optical system PL is formed as a rectangular shape extending along the Y-axis direction (non-scanning direction). The liquid immersion area AR2 filled with the liquid 1 is locally formed at one part on the substrate P which is within an area substantially surrounded by the four recovery ports 23A-23D, so as to include the projection area AR1. It is note that, it is necessary that the liquid immersion area AR2 cover at least the projection area AR1. However, it is not necessary that all of the area surrounded by the four recovery ports 23A-23D become the liquid immersion area.

The first supply port 13 is spaced apart from the projection area AR1 at one side (−X side) of the scanning direction, and the second supply port 14 is spaced apart from the projection area AR1 at the other (+X side) of the scanning direction. That is, the first and second supply ports 13 and 14 are disposed in the vicinity of the projection area AR1, are spaced apart from each other in the scanning direction (X direction), and disposed on both sides of the projection area AR1 so as to interpose the projection area AR1. Each of the first and second supply ports 13 and 14 is formed as an arc-shaped slit having a predetermined length, as viewed from the top. The lengths of the first and second supply ports 13 and 14 along the Y-axis direction are longer than at least the length of the projection area AR1 along the Y-axis direction. The liquid supply device 10 is able to supply the liquid 1 to both side of the projection area AR1 through the first and second supply ports 13 and 14 at the same time.

The inside recovery ports 23A-23D are more distant from the projection area AR1 than the first and second supply ports 13 and 14, and are disposed outside the first and second supply ports 13 and 14 so as to surround the first and second supply ports 13 and 14 and the projection area AR1. Of a plurality (four) of the recovery ports 23A-23D, the recovery ports 23A and 23C are spaced apart from each other in the X-axis direction, and are disposed on both sides of the projection area AR1 so as to interpose the projection area AR1. The recovery ports 23B and 23D are spaced apart from each other in the Y-axis direction, and are disposed on both sides of the projection area AR1 so as to interpose the projection area AR1. The first supply port 13 is disposed between the projection area AR1 and the recovery port 23A, the second supply port 14 is disposed between the projection area AR1 and the recovery port 23C. Each of the recovery ports 23A-23D is formed as an arc-shaped slit having a predetermined length, as viewed from the top. The lengths of the recovery ports 23A and 23C along the Y-axis direction are longer than the lengths of the first and second supply ports 13 and 14 along the Y-axis direction. Each of the recovery ports 23B and 23D is also formed so as to be substantially equal in length to the recovery ports 23A and 23C. The recovery ports 23A-23D are connected to the liquid recovery section 21 through the first to fourth recovery tubes 22A-22D.

The outside recovery ports 61A-61D are more distant from the projection area AR1 than the inside recovery ports 23A-23D, and are disposed outside the inside recovery ports 23A-23D so as to surround the inside recovery ports 23A-23D and the projection area AR1. Of a plurality (four) of the recovery ports 61A-61D, the recovery ports 61A and 61C are spaced apart from each other in the X-axis direction, and are disposed on both sides of the projection area AR1 so as to interpose the projection area AR1. Further, the recovery ports 61B and 61D are spaced apart from each other in the Y-axis direction, and are disposed on both sides of the projection area AR1 so as to interpose the projection area AR1. That is, each of the inside recovery ports 23A-23D is disposed between the outside recovery ports 61A-61D and the projection area AR1. Each of the recovery ports 61A-61D is formed as an arc-shaped slit having a predetermined length, as viewed from the top. The lengths of the recovery ports 61A and 61C along the Y-axis direction is longer than the length of the recovery ports 23A and 23C along the Y-axis direction. Each of the recovery ports 61B and 61D is also formed so as to be substantially equal in length to the recovery ports 61A and 61C.

It is note that the position, the quantity, the shape, and the size of each of the supply ports (13 and 14) and the recovery ports (23 and 61) formed in the passage forming member 30 are not to be considered as limitations in the above description, and various configurations are possible. For example, in this embodiment, the plurality of the recovery ports 23A-23D and 61A-61D are formed to have approximately the same size (length) one another. However, the size may differ from each other. Further, the number of the recovery ports 23 (61) is not limited to four. If the recovery ports 23 (61) are arranged so as to surround the projection area AR1 and the first and second supply ports 13 and 14, an arbitrary number of the recovery ports 23 (61) can be provided, and the number of the recovery ports 23 may differ from the number of the recovery ports 61. Further, the recovery ports 61 are formed longer than the recovery ports 23. However, the recovery ports 61 may be formed shorter than the recovery ports 23. Conceivably, a circular recovery port may be formed by joining the inside recovery ports. Similarly, a circular recovery port may be formed by joining the outside recovery ports. Further, in FIG. 2, the width of the first and second supply ports (13 and 14) is substantially equal to the width of the recovery ports (23A-23D and 61A-61D). However, the width of the recovery ports (23A-23D and 61A-61D) may be greater than the width of the first and second supply ports (13 and 14). To the contrary, the width of the recovery ports may be smaller than the width of supply ports.

Figure 3:
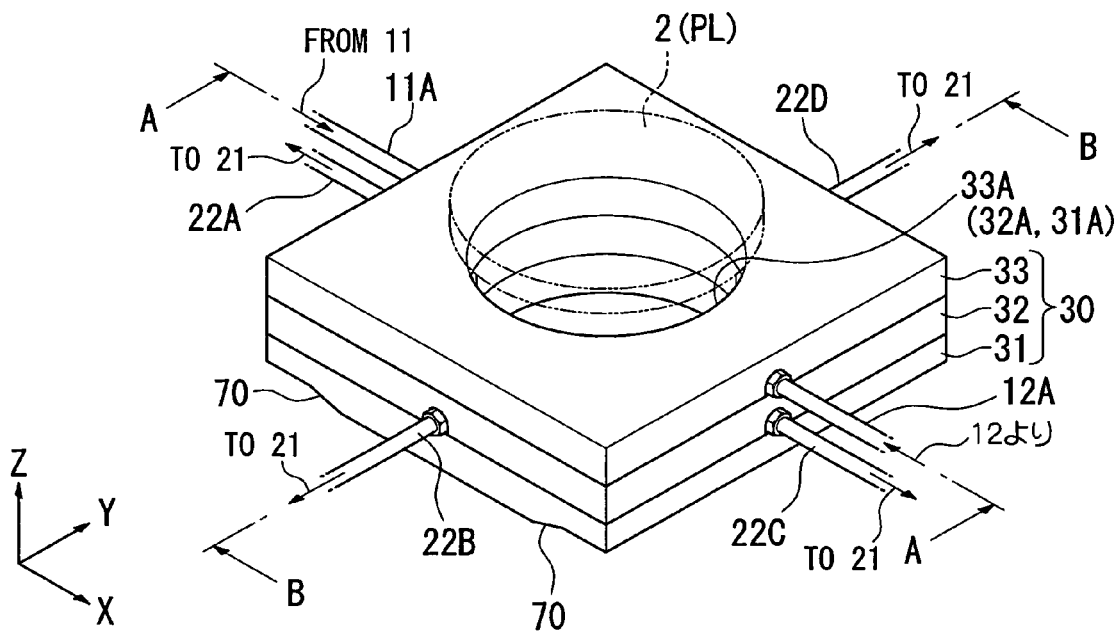
FIG. 3 is perspective view showing a passage forming member which forms a liquid supply device and a liquid recovery device.

FIG. 3 is a schematic perspective view of the passage forming member 30. As shown in FIG. 3, the passage forming member 30 is a circular member arranged so as to surround the optical element 2 at the end portion of the projection optical system PL. The passage forming member 30 includes a first member 31, a second member 32 disposed on the first member 31, and a third member 33 disposed on the second member 32. Each of the first to third members 31-33 which forms the passage forming member 30 is a plate-like member, and hole portions 31A-31C in which the projection optical system PL (optical element 2) is arrangeable are respectively formed in the middle part of each of the first to third members 31-33.

Figure 4:
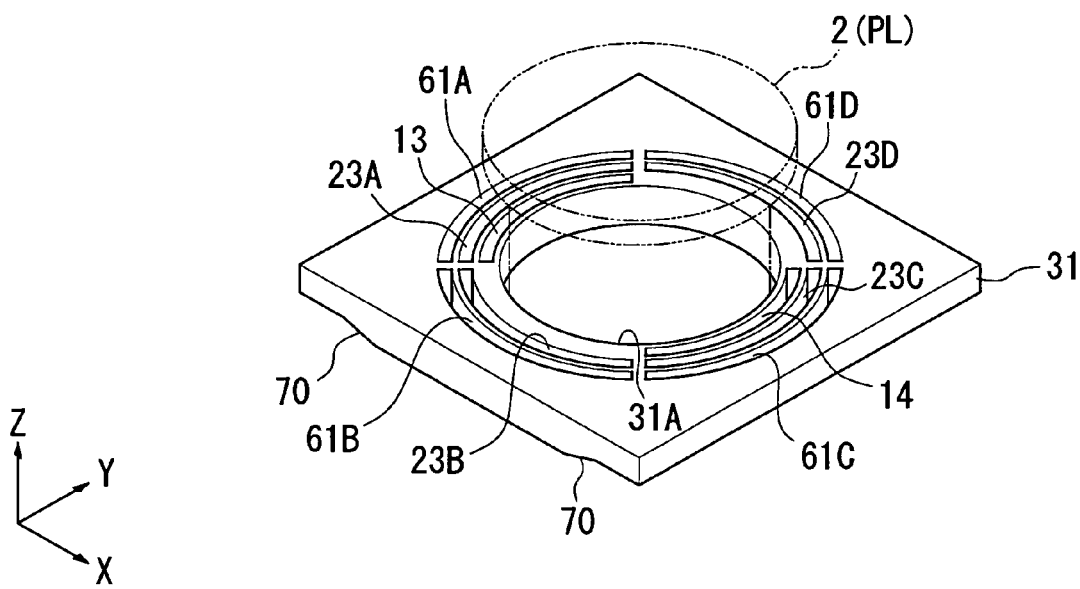
FIG. 4 is perspective view showing a first member which forms the passage forming member.

FIG. 4 is a perspective view showing the first member 31 disposed lowest among the first to third members.

The first member 31 includes: the first supply port 13 for supplying the liquid 1 onto the substrate P, which is formed on the −X side of the projection optical system PL; and the second supply port 14 for supplying the liquid 1 onto the substrate P, which is formed on the +X side of the projection optical system PL. Each of the first supply port 13 and the second supply port 14 is a penetration hole penetrating the first member 31, and is formed as an arc-shape as viewed from the top. Further, the first member 31 includes the recovery ports 23A, 23B, 23C and 23D which are respectively formed on the −X side, the −Y side, the +X side and the +Y side. Each of the recovery ports 23A-23D is also a penetration hole penetrating the first member 31, and is formed as an arc-shape as viewed from the top. The recovery ports 23A-23D are disposed at substantially equal intervals around the projection optical system PL. Further, each of the recovery ports 23A-23D is disposed outside the first and second supply port 13 and 14. The distance between each of the first and second supply port 13 and 14 and the substrate P is substantially equal to the distance between each of the recovery ports 23A-23D and the substrate P. That is, the height of the first and second supply port 13 and 14 is substantially equal to the height of the recovery ports 23A-23D. The recovery ports 61A-61D which are penetration holes penetrating the first member 31 are disposed at substantially equal intervals outside the recovery ports 23A-23D.

Figure 5A:
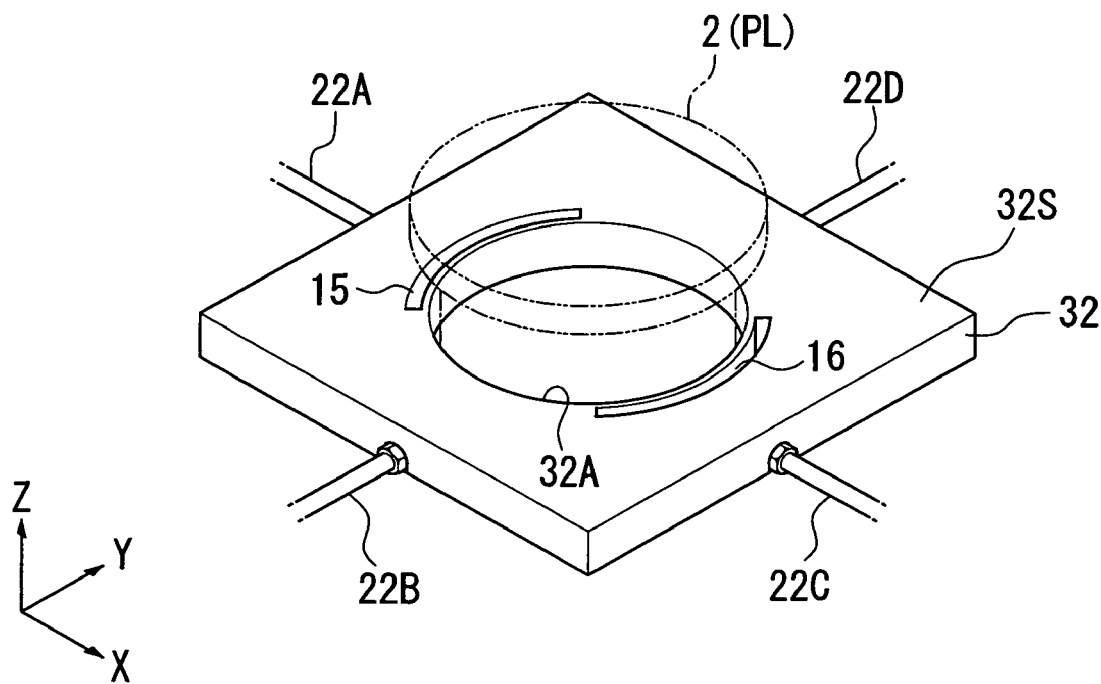
FIG. 5A is perspective view of a second member which forms the passage forming member viewed from above.
Figure 5B:
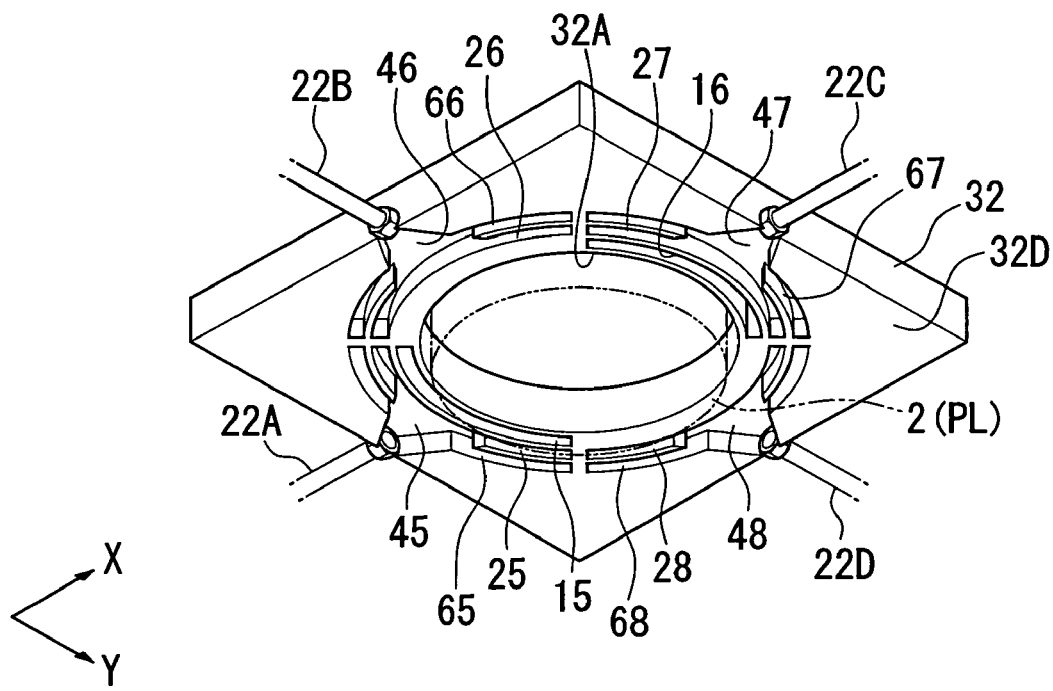
FIG. 5B is perspective view of the second member which forms the passage forming member viewed from below.

FIG. 5A is a perspective view of a second member 32 disposed at the middle of the first to third members as viewed from above, and FIG. 5B is a perspective view of a second member 32 as viewed from below. The second member 32 includes: a first supply hole portion 15 which is formed on the −X side of the projection optical system PL, and which is connected to the first supply port 13 of the first member 31 when the first member 31 is connected to the second member 32; and a second supply hole portion 16 which is formed on the +X side of the projection optical system PL, and which is connected to the second supply port 14 of the first member 31. The first and second supply hole portions 15 and 16 are penetration holes of which the shape and the size as viewed from the top correspond to those of the first and second supply ports 13 and 14. That is, the first and second supply hole portions 15 and 16 are passages formed as an-arc shaped slit as viewed from the top.

As shown in FIG. 5B, an inside recovery groove portion 25 which is connected to the inside recovery port 23A of the first member 31 by connecting the first member 31 to the second member 32 is formed on the −X side of the projection optical system PL on a lower surface 32D of the second member 32. Similarly, an inside recovery groove portion 26 which is connected to the inside recovery port 23B of the first member 31 is formed on the −Y side of the projection optical system PL. An inside recovery groove portion 27 which is connected to the inside recovery port 23C of the first member 31 is formed on the +X side of the projection optical system PL. An inside recovery groove portion 28 which is connected to the inside recovery port 23D of the first member 31 is formed on the +Y side of the projection optical system PL. Each of the inside recovery grooves 25-28 is formed as an-arc shape as viewed from the top so as to correspond to the shape and the size of the inside recovery ports 23A-23D, and they are disposed at substantially equal intervals around the projection optical system PL. Further, the first recovery tube 22A is connected to the inside recovery groove portion 25 by way of a tapered groove portion 45. The tapered groove portion 45 is formed so as to spread horizontally from a connecting portion relating to the first recovery tube 22A to the inside recovery groove portion 25. Similarly, the second recovery tube 22B is connected to the inside recovery groove portion 26 by way of a tapered groove portion 46. The third recovery tube 22C is connected to the inside recovery groove portion 27 by way of a tapered groove portion 47. The fourth recovery tube 22D is connected to the inside recovery groove portion 28 by way of a tapered groove portion 48.

An outside recovery groove portion 65 which is connected to the outside recovery port 61A of the first member 31 by connecting the first member 31 to the second member 32 is formed outside the inside recovery groove portion 25. The outside recovery groove portion 65 is formed so as to cross the tapered groove portion 45. Similarly, each of the outside recovery groove portions 66, 66 and 67 which are respectively connected to the outside recovery ports 61B, 61C and 61D of the first member 31 by connecting the first member 31 to the second member 32, is respectively formed outside the inside recovery groove portions 26, 27 and 28. Each of the outside recovery groove portions 65-68 is formed as an arc-shape as viewed from the top so as to correspond to the shape and the size of the outside recovery ports 61A-61D.

Figure 6A:
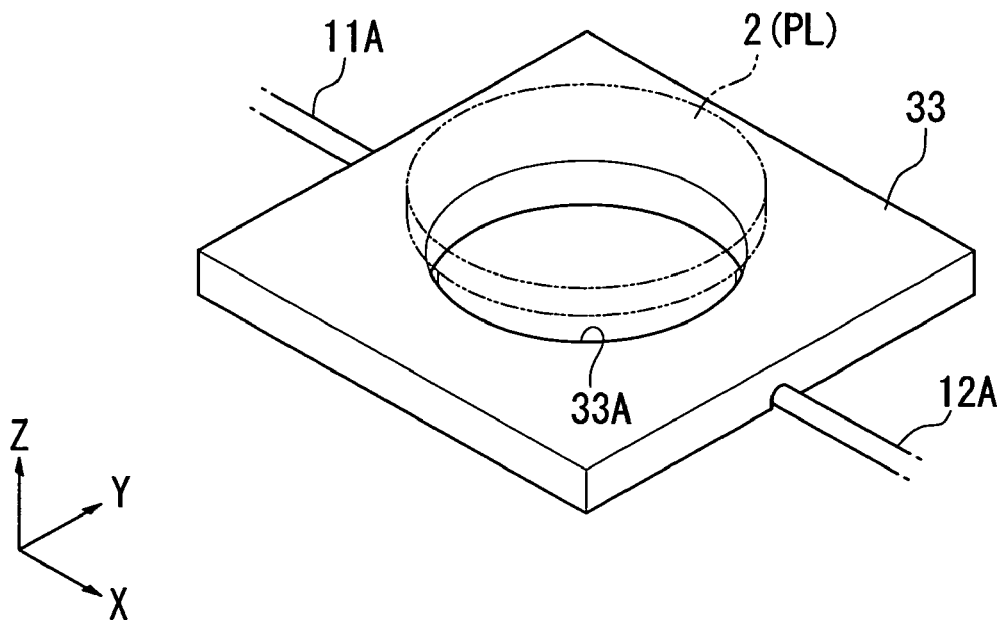
FIG. 6A is perspective view of a third member which forms the passage forming member viewed from above.
Figure 6B:
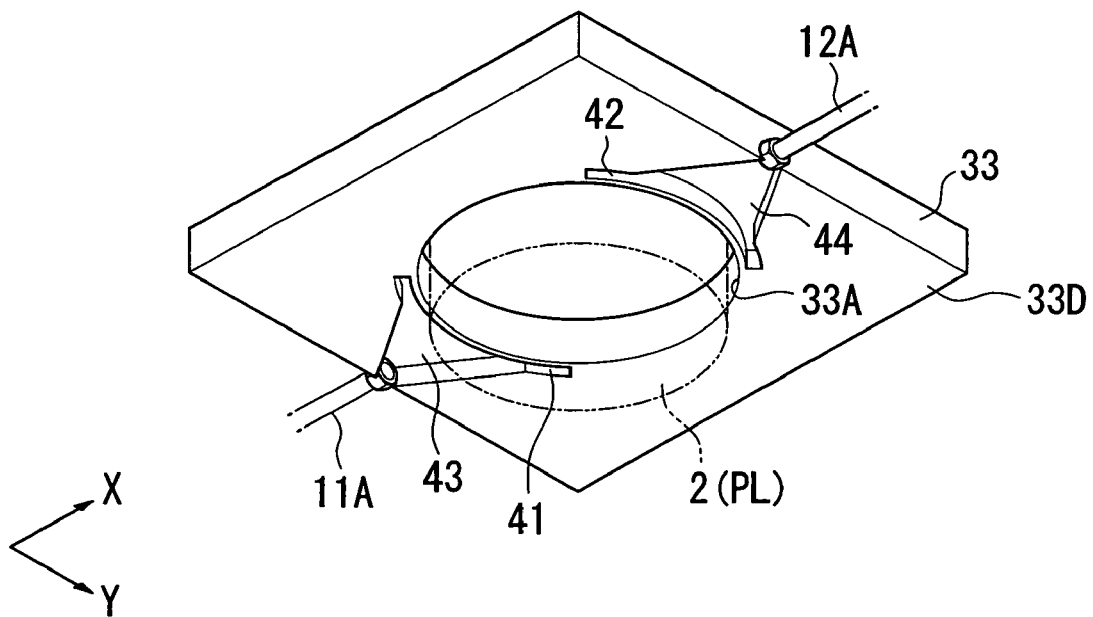

FIG. 6A is a perspective view of a third member 33 disposed at highest among the first to third members as viewed from above, FIG. 6B is perspective view of a third member 33 as viewed from below. A first supply groove portion 41 which is connected to the first supply hole portion 15 of the second member 32 by connecting the second member 32 to the third member 33 is formed on the −X side of the projection optical system PL on the lower surface 33D of the third member 33. A second supply groove portion 42 which is connected to the second supply hole portion 16 of the second member 32 is formed on the +X side of the projection optical system PL on the lower surface 33D. The first and second supply groove portions 41 and 42 are formed as arc-shapes as viewed from the top so that the shape and the size thereof are correspond to those of the first and second supply hole portions 15 and 16 (consequently the first and second supply ports 13 and 14). Further, the first supply tube 11A is connected to the first supply groove portion 41 by way of a tapered groove portion 43. The tapered groove portion 43 is formed so as to gradually spread horizontally from a connecting portion relating to the first supply tube 11A to the first supply groove portion 41.

Similarly, the second supply tube 12A is connected to the second supply groove portion 42 by way of a tapered groove portion 44.

The first to third members 31-33 are made of metal such as stainless steel, titanium, aluminum, an alloy including these metals, or the like. For example, the hole portions and the groove portions of the members 31-33 are formed by electric discharge machining. The passage forming member 30 is formed by uniting the members 31-33 using adhesive, a compression bonding, a fastening member or the like after performing the electric discharge machining of the hole portions and the groove portions of the members 31-33. It is note that it is preferable that electrochemical polishing or nonconductor oxide film processing be performed on the liquid contact surface of each members 31-33. Further, the members which constitute the liquid supply device 10 and the liquid recovery device 20 including the passage forming member 30 may be made of synthetic resin such as polytetrafluoroethylene.

By uniting of the members 31-33, the tapered groove portion 43, the first supply groove portion 41, the first supply hole portion 15 and the first supply port 13 are joined. Thus, a first supply passage 82A which is connected to the first supply tube 11A is formed. Similarly, the tapered groove portion 44, the second supply groove portion 42, the second supply hole portion 16 and the second supply port 14 are joined, and thus a second supply passage 82B which is connected to the second supply tube 12A is formed. Consequently, the liquid 1 discharged from the first liquid supply section 11 is supplied onto the substrate P from above the substrate P through the first supply tube 11A and the first supply passage 82A. The liquid 1 discharged from the second liquid supply section 12 is supplied onto the substrate P from above the substrate P through the second supply tube 12A and the second supply passage 82B.

Further, the tapered groove portion 45, the recovery groove portions 25 and 65, and the recovery port 23A are joined, and thus a first recovery passage 84A which is connected to the first recovery tube 22A is formed. Similarly, the tapered groove portion 46, the recovery groove portions 26 and 66, and the recovery port 23B are joined, and thus a second recovery passage 84B which is connected to the second recovery tube 22B is formed. The tapered groove portion 47, the recovery groove portions 27 and 67, and the recovery port 23C are joined, and thus a third recovery passage 84C which is connected to the third recovery tube 22C is formed. The tapered groove portion 48, the recovery groove portions 28 and 68, and the recovery port 23D are joined, and thus a fourth recovery passage 84D which is connected to the fourth recovery tube 22D is formed. Consequently, the liquid 1 on the substrate P is recovered from above the substrate P through each of the first to fourth recovery passages 84A-84D, and the first to fourth recovery tubes 22A-22D.

At this time, since the first and second supply tubes 11A and 12A are respectively connected to the tapered groove portions 43 and 44, it is possible to supply the liquid so as to make uniform the flow rate distribution and the flow speed distribution at each position of the first and second supply ports 13 and 14 which extend in the Y-axis direction. Similarly, since the recovery tubes 22A-22D are also respectively connected to the tapered groove portions 45-48, it is possible to recover the liquid by using a uniform recovery power.

Figure 7:
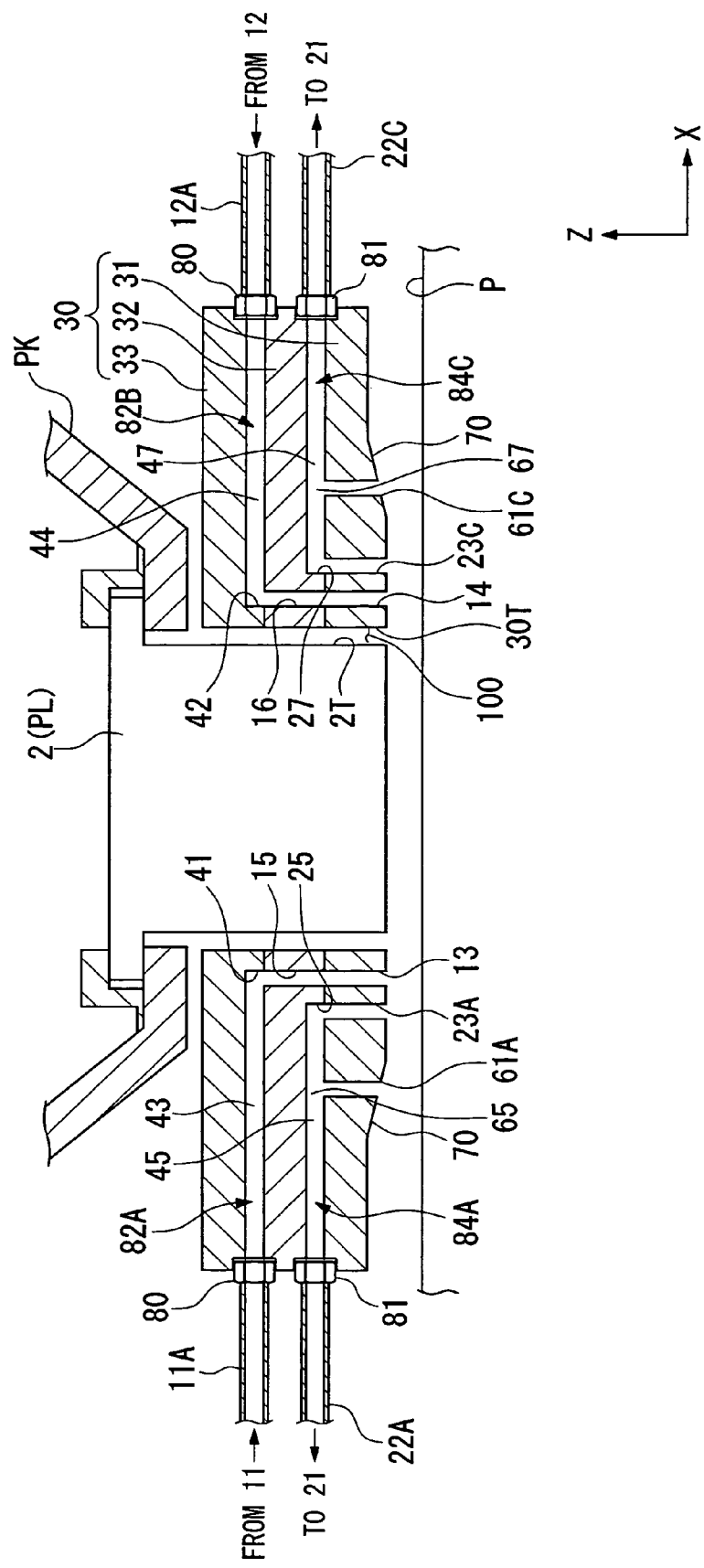
FIG. 7 is cross-sectional view taken along line A-A in FIG. 3.
Figure 8:
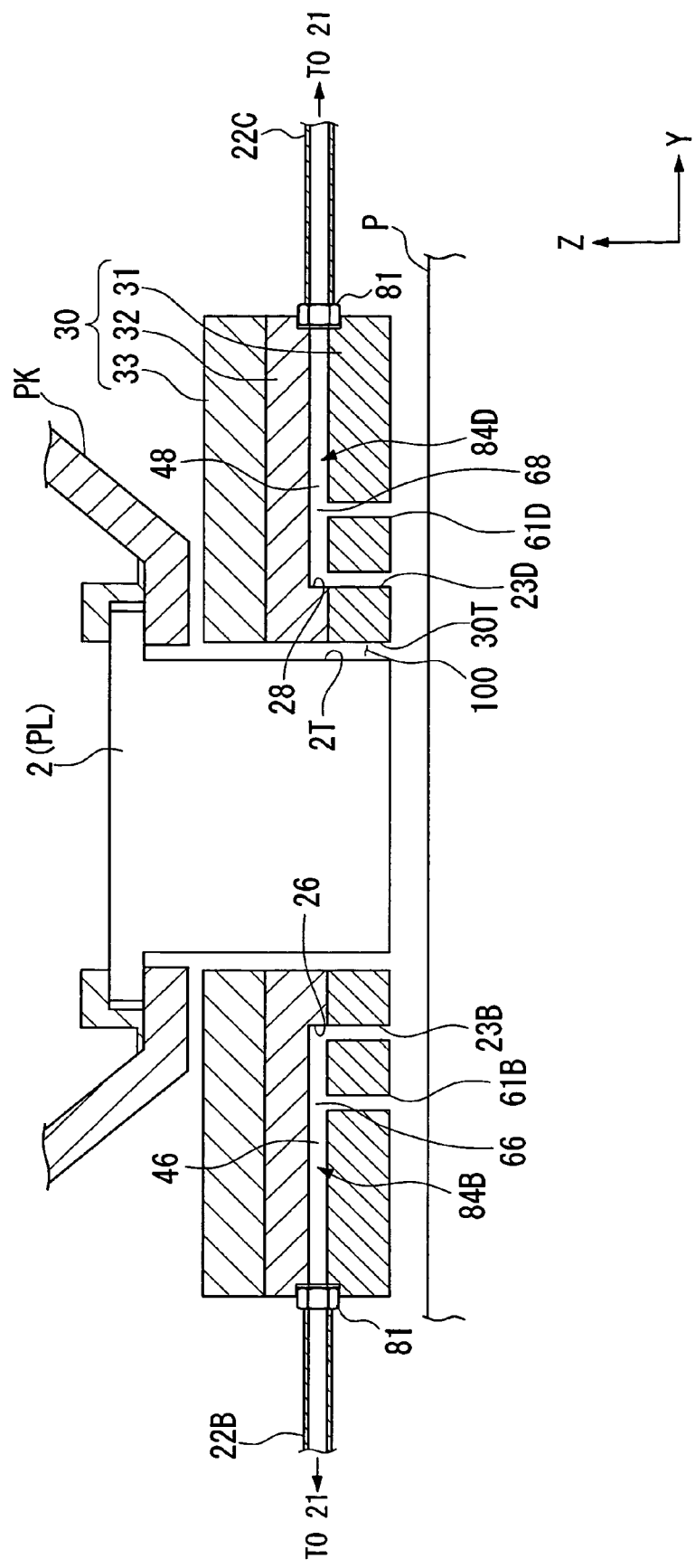
FIG. 8 is cross-sectional view taken along line B-B in FIG. 3.

FIG. 7 is a cross-sectional view taken along line A-A in FIG. 3, and FIG. 8 is a cross-sectional view taken along line B-B in FIG. 3. In the following explanation, the second supply passage 82B and the third recovery passage 84C which are formed within the passage forming member 30 so as to be disposed on the +X side of the projection optical system PL will be explained. It is note that the first supply passage 82A disposed on the −X side of the projection optical system PL, the first recovery passage 82A at the −X side of the projection optical system PL, the second recovery passage 82B at the −Y side, and the fourth recovery passage 82D at the +Y side are similar in construction to the second supply passage 82B or the third recovery passage 84C.

In FIG. 7, the second supply passage 82B is composed of the tapered groove portion 44, the second supply groove portion 42, the second supply hole portion 16 and the second supply port 14. The second supply tube 12A is connected to the second supply passage 82B (passage forming member 30) through a joint member 80. The liquid 1 discharged from the second liquid supply section 12 flows into the second supply passage 82B through the second supply tube 12A. The liquid 1 which flows into the second supply passage 82B flows in the horizontal direction (XY plane direction) through the tapered groove portion 44 of the second supply passage 82B, and turns at a substantially right angle in the vicinity of the supply groove portion 42. Then, the liquid 1 flows in the vertical direction (−Z direction) through the second supply hole portion 16 and the second supply port 14, and is supplied onto the substrate P from above the substrate P.

The third recovery passage 84C is composed of the recovery ports 23C and 61C, the recovery groove portions 27 and 67, and the tapered groove portion 47. The third recovery tube 22C is connected to the third recovery passage 84C (passage forming member 30) through a joint member 81. When the liquid recovery section 21 having the vacuum system is driven, the liquid 1 on the substrate P flows upward into the third recovery passage 84C direction (+Z direction) through the recovery ports 23C and 61C disposed above the substrate P. The liquid 1 which flows into the third recovery passage 84C turns to the horizontal direction in the vicinity of the recovery groove portions 27 and 67, and flows in the horizontal direction through the tapered groove portion 47. After that, the liquid 1 is suctioned and recovered by the liquid recovery section 21 through the third recovery tube 22C.

A small gap 100 is formed between the inner surface 30T of the passage forming member 30 and the side surface 2T of the optical element 2 at the end portion of the projection optical system PL which contacts the liquid 1. The small gap 100 is prepared for separating the optical element 2 of the projection optical system PL from the passage forming member 30 so that vibration does not transmit. Therefore, it is possible to prevent the vibration generated at the liquid supply device 10 and the liquid recovery device 20 from transmitting to the projection optical system PL. Both of the liquid supply device 10 and the liquid recovery device 20 including the passage forming member 30 are supported by support members excluding the projection optical system PL and support members supporting the projection optical system PL.

It is note that it is preferable to carry out liquid-repellent (water-repellent) processing on upper parts of an inner surface 30T of the passage forming member 30 and a side surface 2T of the optical element 2 between which the small gap 100 is formed. As liquid-repellent processing, for example, coating with materials having a liquid-repellent property may be applicable. As a material having liquid-repellent property, for example, a fluorinated compound, silicon compound, or synthetic resin such as polyethylene may be usable. Further, the thin film for surface processing may be a single layered film, or may be multilayered film.

The following explains a procedure for exposing the substrate P with the pattern image of the mask M by using the exposure apparatus EX described above.

The exposure apparatus EX of this embodiment projection-exposes the pattern image of the mask M onto the substrate P while moving the mask M and the substrate P in the X-axis direction (scanning direction). During scanning exposure, a pattern image of one part of the mask M is projected onto the rectangular projection area AR1 disposed under the end portion of the projection optical system PL. In synchronization with the movement of the mask M in the –X direction (or in the +X direction) at speed V, the substrate P is moved in the +X direction (or in the –X direction) at speed β·V (β is the projection magnification) by the XY stage 53. A plurality of shot areas are set on the substrate P, and after exposing one of the shot areas, the next shot area is moved to the scanning start position by the stepping movement of the substrate P. In this way, a scanning exposure process for each of the shot areas is successively performed while moving the substrate P through the step-and-scan method.

When the exposure process is performed, the controller CONT drives the liquid supply device 10, and starts the liquid supply operation for to the substrate P. The liquid 1 discharged from each of the first and second liquid supply sections 11 and 12, after flowing through the supply tubes 11A and 12A, is supplied onto the substrate P through the supply passages 82A and 82B formed inside the passage forming member 30.

The liquid 1 supplied on the substrate P flows under the projection optical system PL in synchronization with the movement of the substrate P. For example, while the substrate P moves in the +X direction during exposure of one shot area, the liquid 1 flows under the projection optical system PL in the same direction of the substrate P, that is, in the +X direction at substantially the same speed as that of the substrate P.

Figure 9:
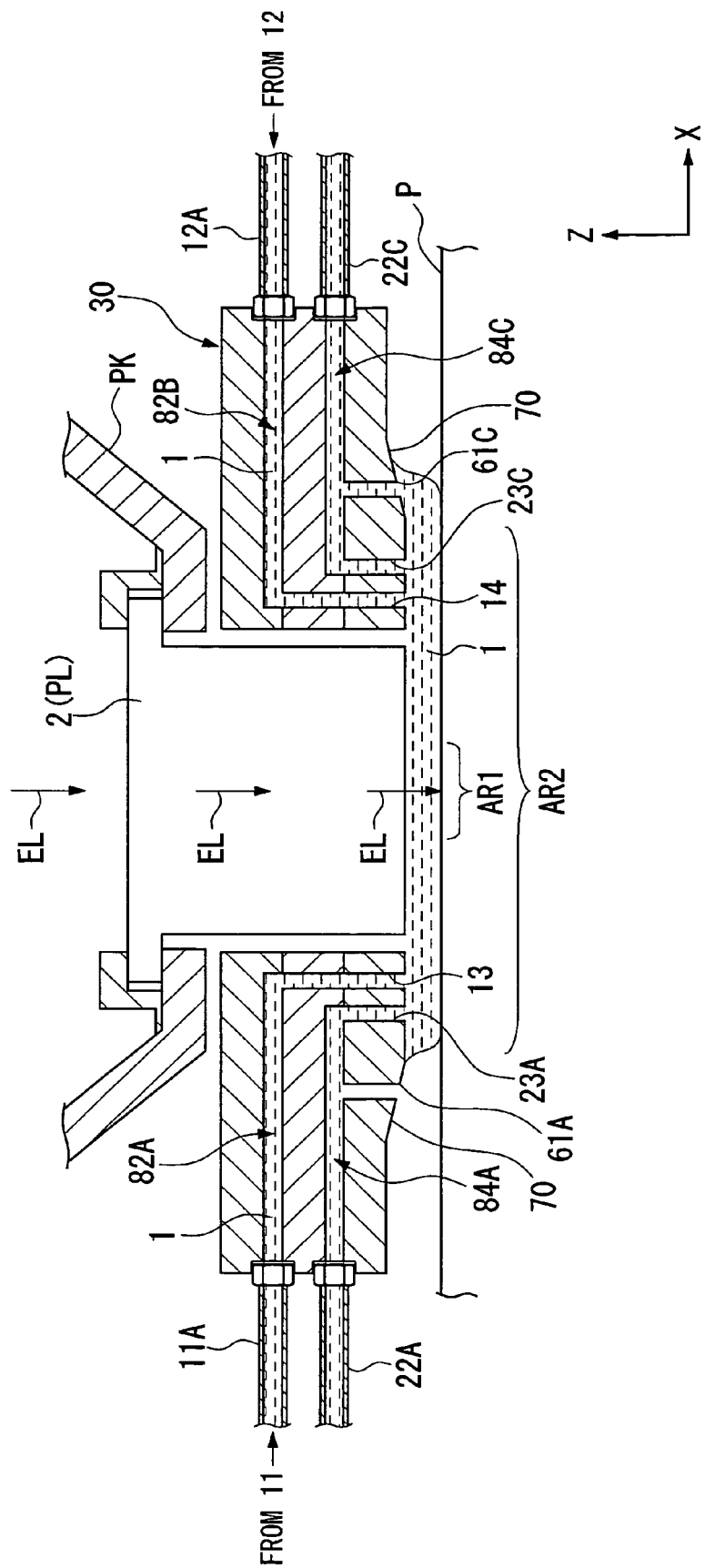
FIG. 9 is schematic view showing liquid supply operation and recovery operation while exposing the substrate.

FIG. 9 is a schematic view showing a state where exposure operation is performed for the substrate P. In FIG. 9, the exposure light EL which passes through the mask M after being emitted from the illumination optical system IL is irradiated to the image plane side of the projection optical system PL. Thus, the pattern of the mask M is exposed onto the substrate P through the projection optical system PL and the liquid 1 in the liquid immersion area AR2. While the exposure light EL is irradiated to the image plane side of the projection optical system PL, that is, during exposure of the substrate P, the controller CONT performs liquid supply operation onto the substrate P using the liquid supply device 10 and the liquid recovery operation from the top of the substrate P using the liquid recovery device 20. Therefore, the liquid immersion area AR2 is desirably formed on the substrate P.

In this embodiment, during the exposure operation, the liquid supply device 10 supplies the liquid 1 onto the substrate P from both sides of the projection area AR1 through the first and second supply ports 13 and 14. Therefore, the liquid 1 supplied onto the substrate P through the first and second supply ports 13 and 14 is sufficiently spread while causing the wetting between the lower end surface of the optical element 2 at the end portion of the projection optical system PL and the substrate P, and forms the liquid immersion area AR2 which is at least larger than the projection area AR1.

It is note that when the liquid 1 is supplied onto the substrate P from both sides of the scanning direction of the projection area AR1, the controller CONT may set so that the quantity of liquid supplied from one side of the scanning direction to the projection area AR1 per unit of time is greater than the quantity of liquid supplied from the opposite side of the scanning direction to the projection area AR1 by controlling the liquid supply operation of the first and second liquid supply sections 11 and 12 of the liquid supply device 10. For example, when the exposure process is performed while moving the substrate P in the +X direction, the controller CONT sets so that the quantity of the liquid 1 supplied from the –X side (that is, the supply port 13) to the projection area AR1 is larger than the quantity of the liquid 1 supplied from the +X side (that is, the supply port 14). When the exposure process is performed while moving the substrate P in the –X direction, the controller CONT sets so that the quantity of the liquid 1 supplied from the +X side to the projection area AR1 is larger than the quantity of the liquid 1 supplied from the –X side.

For example, when the substrate P is moved in the +X direction, the quantity of the liquid 1 which moves in the +X direction within the projection area AR1 increases, the liquid 1 cannot be recovered sufficiently through the inside recovery port 23C, and thus a large quantity of the liquid 1 may flow out to outside of the substrate P. However, the liquid 1 which moves in the +X direction is recovered through the outside recovery port 61D disposed outside the inside recovery port 23C. Therefore, it is possible to prevent inconvenient problems such as the liquid 1 remaining on the substrate P, or flowing out or splashing to the surroundings of the substrate P. At the worst, if not the liquid 1 can be recovered sufficiently through the outside recovery port 61C, the remaining liquid 1 can be captured by the trap surface 70 disposed on the +X side of the lower surface of the passage forming member 30. Therefore, it is possible to reliably prevent the liquid 1 from flowing out.

In addition, for example, after exposing the substrate P while moving the substrate P in the +X direction, the moving direction of the substrate P can be reversed, and when the substrate P is moved in the –X direction, a small quantity of the liquid 1 which is moved to the +X side of the recovery port 23C becomes liquid droplets, and the droplets of the liquid 1 may remain on the substrate P. However, since the outside recovery port 61C is prepared, it is possible to recover the remaining liquid (liquid droplets) 1 through the outside recovery port 61C.

As described above, since the inside recovery ports 23 are disposed outside the first and second supply ports 13 and 14, and the outside recovery ports 61 are disposed outside the inside recovery ports 23, if not the liquid 1 on the substrate P can be recovered sufficiently through the inside recovery ports 23, it is possible to recover the liquid 1, which intends to flow out, through the outside recovery ports 61. Therefore, it is possible to prevent exposure accuracy from deteriorating due to liquid which remains on the substrate P and the liquid 1 which flows out to the outside of the substrate P.

Further, since each of the inside recovery ports 23 and the outside recovery ports 61 is arranged so as to surround the first and second supply ports 13 and 14 and the projection area AR1, it is possible to reliably prevent the liquid 1 from flowing but, splashing or remaining.

It is note that the recovery ports of this embodiment are double recovery ports composed of the inside recovery ports and the outside recovery ports. However, the recovery ports may be also triple or quadruple recovery ports disposed outside the inside recovery ports and the outside recovery ports. That is, the number of the recovery ports is arbitrary.

In this embodiment, the outside recovery ports 61 join at a point along the recovery passage 84 connected to the inside recovery port 23. However, a recovery passage connected to the outside recovery port 61 may be arranged so as to be independent of the recovery passage 84.

In this embodiment, the outside recovery ports 61 are arranged so as to surround the projection area AR1. However, they may be arranged at one part of the surrounding of the projection area AR1. For example, the outside recovery ports 61B and 61D may be left out, and the outside recovery ports (61A and 61C) may be respectively disposed on both side of the scanning direction relative to the projection area AR1.

It is note that in order to recover the liquid smoothly, internal surfaces of the recovery passage 84 in the vicinity of the recovery ports 23 and 61 can be subjected to the lyophilic processing (hydrophilic processing). The liquid 1 of this embodiment is water having high polarity. Then, the hydrophilic property may be added to an inside wall surface of the recovery passage 84 by forming a thin film made from a material having highly-polar molecular structure such as alcohol or by irradiating with ultraviolet (UV), as the hydrophilic processing (the lyophilic processing) for the recovery ports 23 and 61. Furthermore, it is note that the lyophilic processing can be applied to surfaces of flow passages of the liquid 1 in the liquid supply device 10 and/or the liquid recovery device 20 other than the vicinity of the recovery ports 23 and 61.

It is note that after completing exposure of one substrate P, a small quantity of the liquid 1 may remain on the substrate P and/or the substrate stage PST. After completing exposure of the substrate P, the controller CONT may suction and recover the liquid 1 on the substrate P and the substrate stage PST through the recovery ports 23 (61) of the liquid recovery device 20, by driving the vacuum system of the liquid recovery device 20. In the case where the liquid 1 on the substrate P is recovered after completing exposure of the substrate P, the controller CONT relatively moves the recovery ports 23 (61) of the liquid recovery device 20 disposed above the substrate P and the substrate stage PST which is movable while holding the substrate P, and recovers the liquid 1 on the substrate P or the substrate stage PST.

It is note that, in this embodiment, the first and second supply ports 13 and 14 of the liquid supply device 10 are respectively disposed on both sides of the scanning direction (Y-axis direction) relative to the projection area AR1. However, other supply ports may be disposed on both sides of the non-scanning direction (Y-axis direction), and the liquid may be supplied in combination with the supply ports. In this case, the supply ports respectively disposed on both sides of the projection area AR1 relating to the scanning direction may be left out. Further, the supply ports may be arranged circularly so as to completely surround the projection area AR1, or the supply ports may be disposed at one position in the vicinity of the projection area AR1. However, any case, in order to prevent impact (that is, a water hammer phenomenon) with stopping of the liquid supply, it is desirable to continue supplying the liquid through the supply ports while exposing a plurality of the shot areas on the substrate P.

It is note that, in this embodiment, the trap surface 70 is disposed on both sides of the scanning direction relative to the projection area AR1 on a lower surface of the first member 31. However, the trap surface 70 may be arranged along the non-scanning direction. On the other hand, in the case where the trap surface 70 is disposed only at both sides of the scanning direction relative to the projection area AR1, since the liquid 1 tends to flow out toward both sides of the scanning direction, it is possible to capture the liquid 1 having an inclination to flow out. Further, it is not necessary for the trap surface 70 to be a flat surface. For example, the trap surface 70 may be formed by combination of a plurality of flat surfaces. Further, the trap surface 70 may be spherical, and may be subjected to surface area enlargement processing, specially, surface roughening.

It is note that, in this embodiment, the passage forming member 30 is formed by combining three members. However, the number of members is not limited as above. Further, in this embodiment, the members 31-33 which form the passage forming member 30 are rectangular plate members. However, the members 31-33 may be circular plate members, and may be elliptic plate members long in the X-axis direction. Further, a member in which the passages connecting to the first and second supply ports 13 and 14 are formed may differ from a member in which the passages connecting to the recovery ports 23A, 23B, 23C and 23D are formed, and the passages respectively connecting to the ports may be formed with respect to the separate members.

The following explains a second embodiment of an exposure apparatus of the present invention. In the following explanation, the same or equivalent components as in the embodiment described above are given the same reference numerals, and corresponding descriptions thereof are simplified or omitted.

Figure 10:
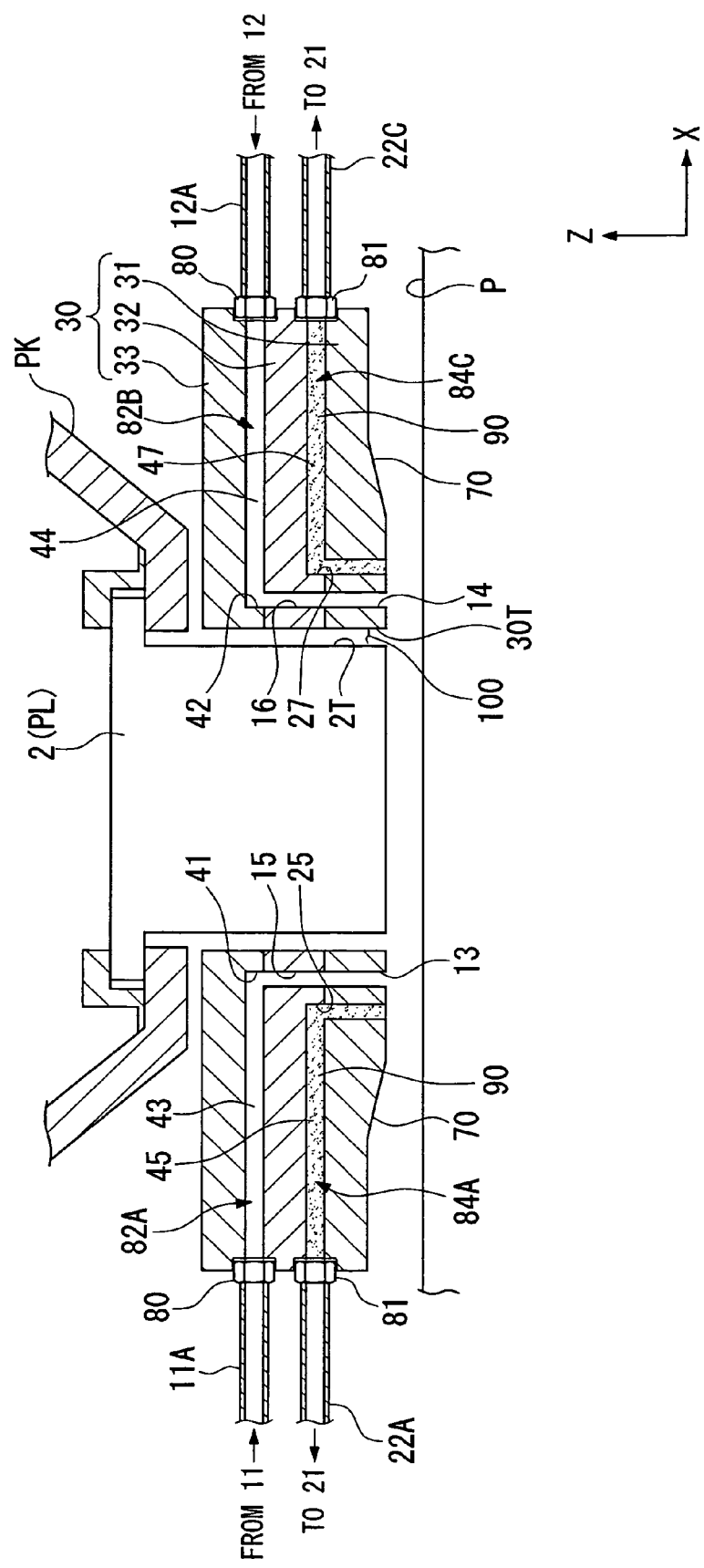
FIG. 10 is enlarged cross-sectional view showing a principal part of a second embodiment of an exposure apparatus of the present invention.
Figure 11:
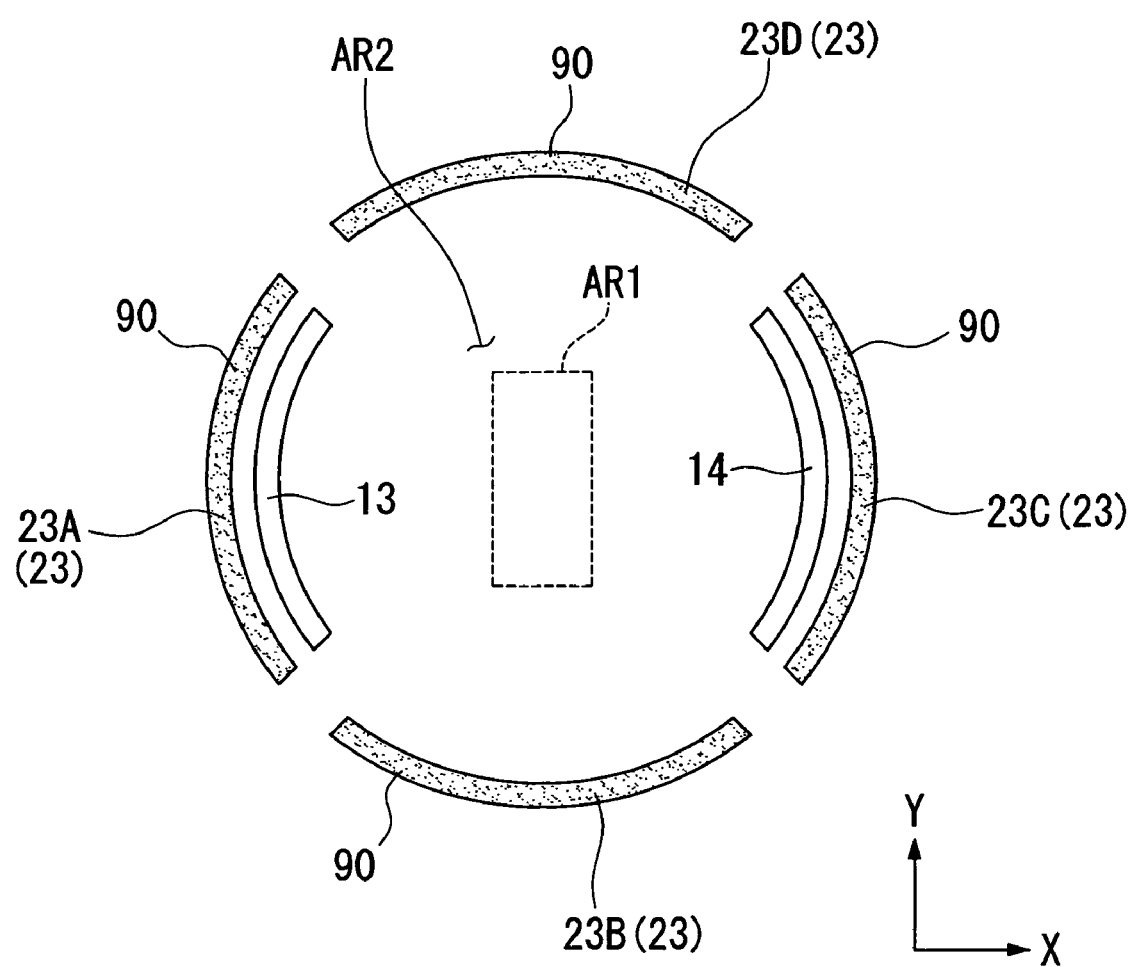
FIG. 11 is general plan view of the second embodiment of the exposure apparatus of the present invention.

FIG. 10 is a cross-sectional view of the passage forming member 30, and FIG. 11 is a view showing the positional relationship between the supply ports and the recovery ports, and the projection area AR1. This embodiment is explained on the basis in which the liquid recovery device 20 is not provided with the outside recovery ports (61), and is provided with only the recovery ports (inside recovery ports) 23.

In this embodiment, particularly, porous members 90 are respectively disposed inside the recovery ports 23. As shown in FIG. 10 and FIG. 11, the porous members 90 are arranged so as to fill up inside the recovery passages 84 formed in the passage forming member 30. As the porous members 90, porous material such as porous ceramics, a spongy member or a mesh member may be used. It is note that the porous members 90 may be disposed on one part of the recovery passage 84, such as in the vicinity of the recovery port 23, or at the corner of the recovery passage 84. Further, when the porous members 90 are disposed inside the recovery passage 84, the porous members 90 are respectively disposed inside the recovery ports 23, the recovery groove portions 25-28, the tapered groove portions 45-48 and the like, in a state where the first to third member 31-33 are separated from each other. Then, the first to third members 31-33 are united with each other. Therefore, it is possible to dispose the porous members 90 inside of the recovery passages 84 of the passage forming member 30.

Since the porous members 90 are disposed inside the recovery ports 23, it is possible to prevent noise and/or vibration from occurring while the liquid 1 is recovered. In this embodiment, a local liquid immersion manner in which the liquid immersion area AR2 is formed at one part of the top of the substrate P is applied, and the liquid recovery device 20 suctions and recovers the liquid 1 on the substrate P from above the substrate P through the recovery ports 23 (23A-23D), using the vacuum system (vacuum pump). In this case, the liquid recovery device 20 may recover the liquid 1 on the substrate P with surrounding gas (so as to suction the liquid with the surrounding gas). If the liquid recovery device 20 recovers the liquid 1 with the surrounding gas through the recovery ports 23, the liquid 1 flows into the recovery passages 84 (84A-84D) intermittently. Then, the liquid 1 which flows into the recovery passages 84 disperses like drops (liquid droplets). It is thought that the noise and/or the vibration are caused by striking of the liquid droplets against the recovery passages 84 and the recovery tubes 22. In this case, if the liquid droplets are large, when the liquid droplets hit the inside wall of the recovery passages and the recovery tubes, the force (impulse) of the droplets becomes large. Thus, it is thought that noise and/or vibration are increased. Consequently, in this embodiment, since the porous members 90 are disposed inside the recovery ports 23, the droplets of the liquid 1 recovered through the recovery ports 23 become reduced in size, and thus the droplets can be recovered. Therefore, it is possible to reduce the force (impulse) of the droplets which is generated when the liquid droplets hit the inside wall of the recovery passages and the recovery tubes, thus it is possible to reduce noise and/or vibration.

It is note that porous members 90 may be respectively disposed not only inside the supply ports (supply passages) but the recovery ports (recovery passages). Also, porous members 90 may be disposed inside the outside recovery ports 61 of the first embodiment.

Figure 12:
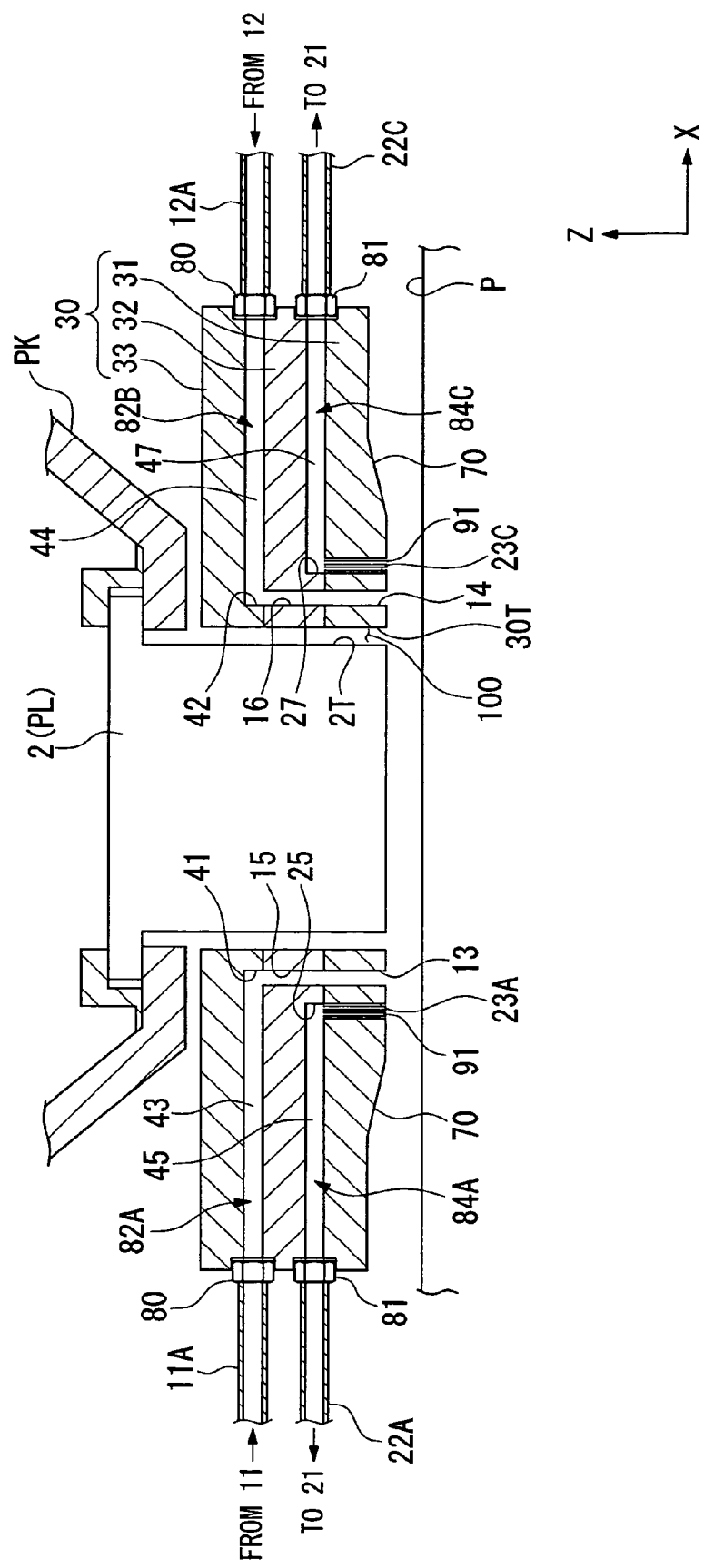
FIG. 12 is enlarged sectional view showing a principal part of a third embodiment of an exposure apparatus of the present invention.
Figure 13:
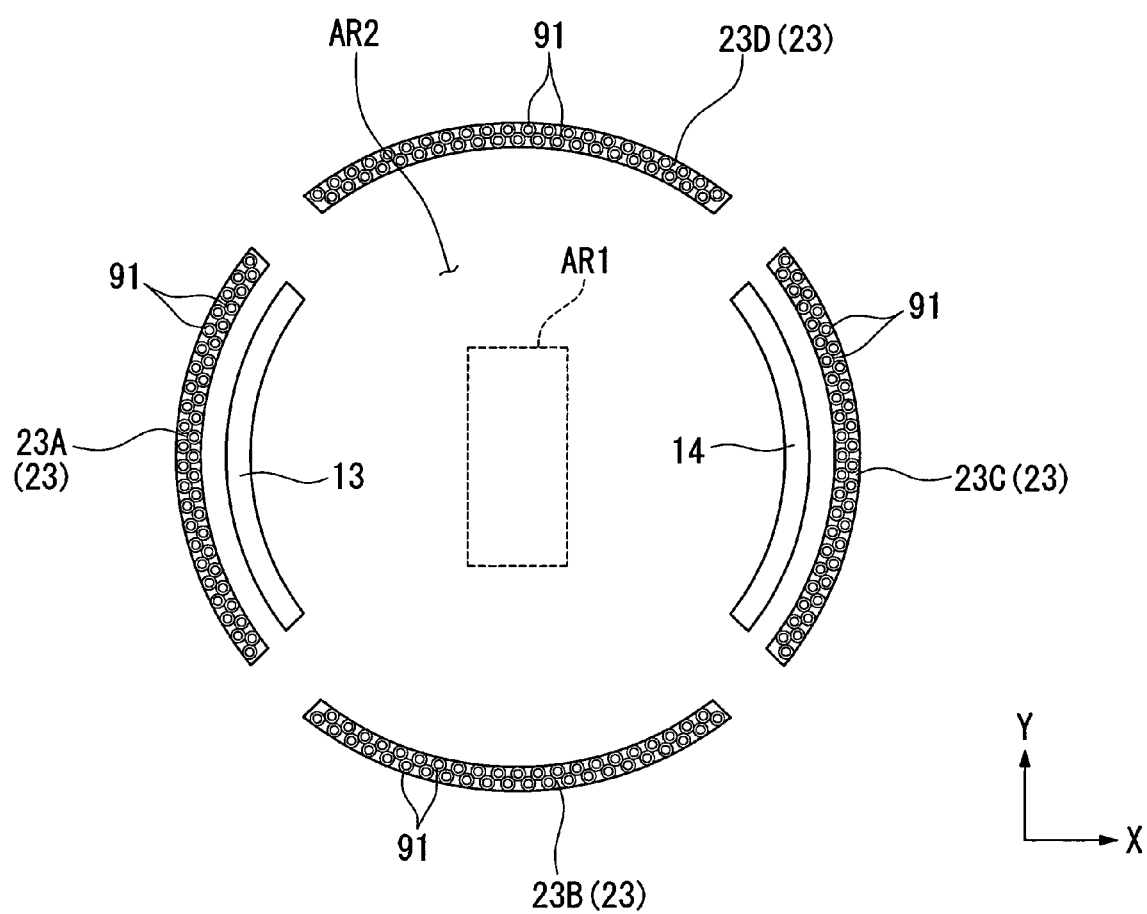
FIG. 13 is general plan view of the third embodiment of the exposure apparatus of the present invention.

The following explains a third embodiment of an exposure apparatus of the present invention referring to FIG. 12 and FIG. 13. In this embodiment, particularly, assemblies of capillary tubes 91 are respectively disposed inside the recovery ports 23. As shown in FIG. 12 and FIG. 13, the assemblies of capillary tubes 91 are disposed inside the recovery ports 23. The capillary tubes 91 are arranged so that the longitudinal directions thereof coincide with the recovery passage 84. The assembly of capillary tubes 91 divides the recovery port 23 into a plurality of passages. In this embodiment, as shown in FIG. 12, the capillary tubes 91 are disposed inside one part of the recovery passage 84, which extends from the recovery port 23 in the vertical direction. Further, as shown in FIG. 13, the capillary tubes 91 are arranged in two rows along the slit length direction of the recovery port 23.

For example, the capillary tubes 91 are made of glass, metal such as copper, synthetic resin, rubber or the like. Particularly, since glass and metal have hydrophilic properties, by using glass or metal as the material of the capillary tubes 91, it is possible to recover the liquid on the substrate P smoothly.

Also, since the capillary tubes 91 are disposed inside the recovery port 23, the liquid 1 becomes small droplets, and thus the droplets of the liquid 1 can be recovered. Therefore, it is possible to reduce the force (impulse) of the droplets which is generated when the liquid droplets hit the inside wall of the recovery passages and the recovery tubes, and thus it is possible to reduce noise and/or vibration.

It is note that tubes of which the internal diameter is substantially 10 μm to 1 mm are used as the capillary tubes 91. If the internal diameter of the tubes is equal to 1 mm or over, since the diameter of the droplet becomes large due to passing of the liquid through the capillary tubes 91, vibration may not be possible to reduced. If the internal diameter of the tubes is equal to 10 μm or less, due to the viscosity of the liquid or the like, the liquid may not to be possible to suction and recover smoothly. It is note that if the availably vibration level, the kind of liquid or the like are changed, the internal diameter of the capillary tubes 91 is not limited to described value.

Further, in this embodiment, the capillary tubes 91 are arranged in two rows along the slit width direction of the recovery port 23. However, the capillary tubes 91 may be arranged in an arbitrary number of rows such as one row or three rows or more. When the liquid droplets formed by passing of the liquid through the capillary tubes 91 hit the inside wall of the inner passages and the recovery tubes, if it is possible to adjust the size of the liquid droplets so as not to affect exposure accuracy, the internal diameter and the number of the capillary tube 91 arranged and the position thereof may be arbitrarily set. Further, for example, a large number of first capillary tubes may be disposed in the vicinity of the recovery ports 23, and a number of second capillary tubes which are thicker than the first capillary tubes may be disposed on the downstream side (recovery tube side) of the recovery passages 84. That is, the internal diameter and the number of the capillary tube 91 may be distributed along the direction of the passage, and the internal diameter and the number of the capillary tubes 91 may be distributed along the width direction of the recovery port 23. In addition, the assemblies of the capillary tubes may be left out, and a number of plate members (capillary plates) having small passages (holes) may be respectively disposed inside the recovery port.

It is note that, in this embodiment, the capillary tubes 91 are disposed in the vicinity of the recovery port 23. However, the capillary tubes 91 may be disposed at one part of the recovery passage 84, such as the vicinity of the recovery port 23, the corner of the recovery passage 84, or the like. The capillary tubes 91 may be disposed inside all of the recovery passage 84. In the case where the recovery passage 91 is disposed at the corner of the recovery passage 84, or all of the recovery passage 84, it is preferable to bend the capillary tubes 91 around the corner.

Further, the capillary tubes 91 may be disposed inside the recovery port (recovery passage), and may also be disposed inside the outside recovery port 61 of the first embodiment.

In addition, in a case where the capillary tubes 91 are disposed inside the recovery passage 84, as in the case where the porous member 90 is disposed, it is preferable that the capillary tubes 91 be disposed inside the recovery port 23, the recovery groove portions 25-28, the tapered groove portions 45-48 and the like, and then the first to third members 31-33 be united with each other.

Figure 14:
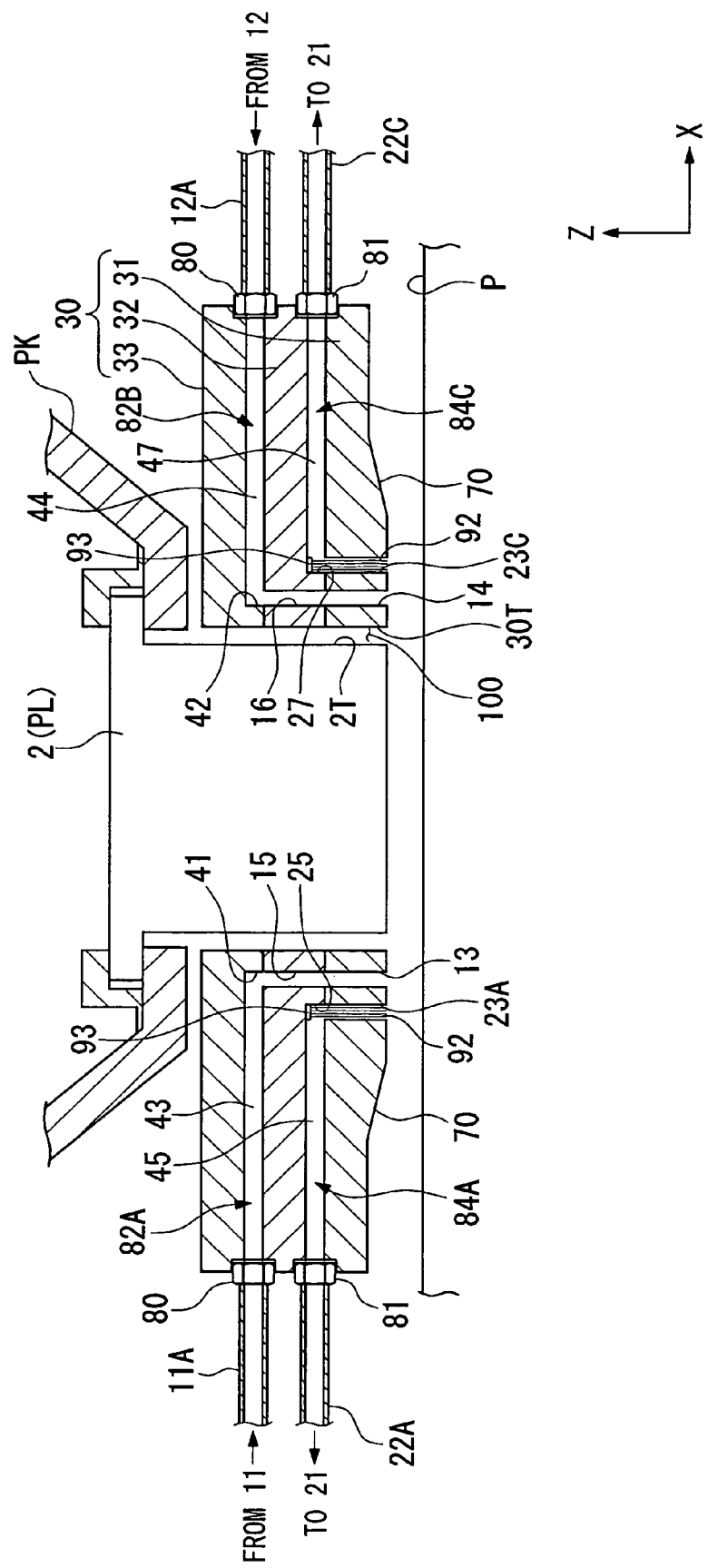
FIG. 14 is enlarged sectional view showing a principal part of a fourth embodiment of an exposure apparatus of the present invention.

The following explains a fourth embodiment of the present invention referring to FIG. 14. In this embodiment, particularly, a brushy member 92 which has a function similar to that of the capillary tube member is disposed inside the recovery port 23. As shown in FIG. 14, brushy members 92 are respectively disposed inside the recovery ports 23. The brushy member 92 is a bundle of glass fibers or metal fibers held by a holder 93, and is arranged so that the longitudinal direction thereof coincides with the recovery passage 84. In this embodiment, the brushy member 92 is disposed inside one part of the recovery passage 84, which extends from the recovery port 23 in the vertical direction. The holder 93 holding the brushy member 92 is fixed on an inside wall portion of the recovery passage 94.

As described above, the brushy members 92 are respectively disposed inside the recovery ports 23, and the liquid 1 becomes small droplets due to the passing of the liquid 1 recovered through the recovery ports 23 through the brushy members 92, and thus the droplets of the liquid 1 can be recovered. Therefore, it is possible to reduce the force (impulse) of the droplets which is generated when the liquid droplets hit the inside wall of the recovery passages and the recovery tubes, and thus it is possible to reduce noise and/or vibration.

It is note that, in this embodiment, the brushy member 92 is disposed inside one part of the recovery passage 84, which extends from the recovery port 23 in the vertical direction. However, the brushy member 92 may be disposed at one part of the recovery passage 84, such as the corner of the recovery passage 84, the horizontal parts (tapered groove portions 45-48) or the like. The brushy member 92 may be disposed inside all of the recovery passage 84. Further, the brushy member 92 may be disposed inside the supply port (supply passage), and may also be disposed inside the outside recovery port 61 of the first embodiment.

It is note that in a case where the brushy member 92 is fixed inside the recovery passage 84 by the holder 93, as in the case where the porous member 90 is disposed, it is preferable that the brushy members 92 be respectively disposed inside the recovery ports 23, the recovery groove portions 25-28, the tapered groove portions 45-48 and the like, and then the first to third members 31-33 be with united each other.

It is note that a porous member 90, capillary tubes 91 and a brushy member 92 may be disposed inside the recovery port 23 (recovery passages 84) in combination. For example, the porous member 90 may be disposed in the vicinity of the recovery port 23 of the recovery passage 84, and the capillary tubes 91 may be disposed on the downstream side of the recovery port 23 (recovery tube 22 side). The capillary tubes 91 may be disposed in the vicinity of the recovery port 23, and the porous member 90 may be disposed on the downstream side of the recovery port 23. Also, the porous members 90 and the assemblies of the capillary tubes 91 may be alternately disposed inside the recovery passage along the passage.

Figure 15:
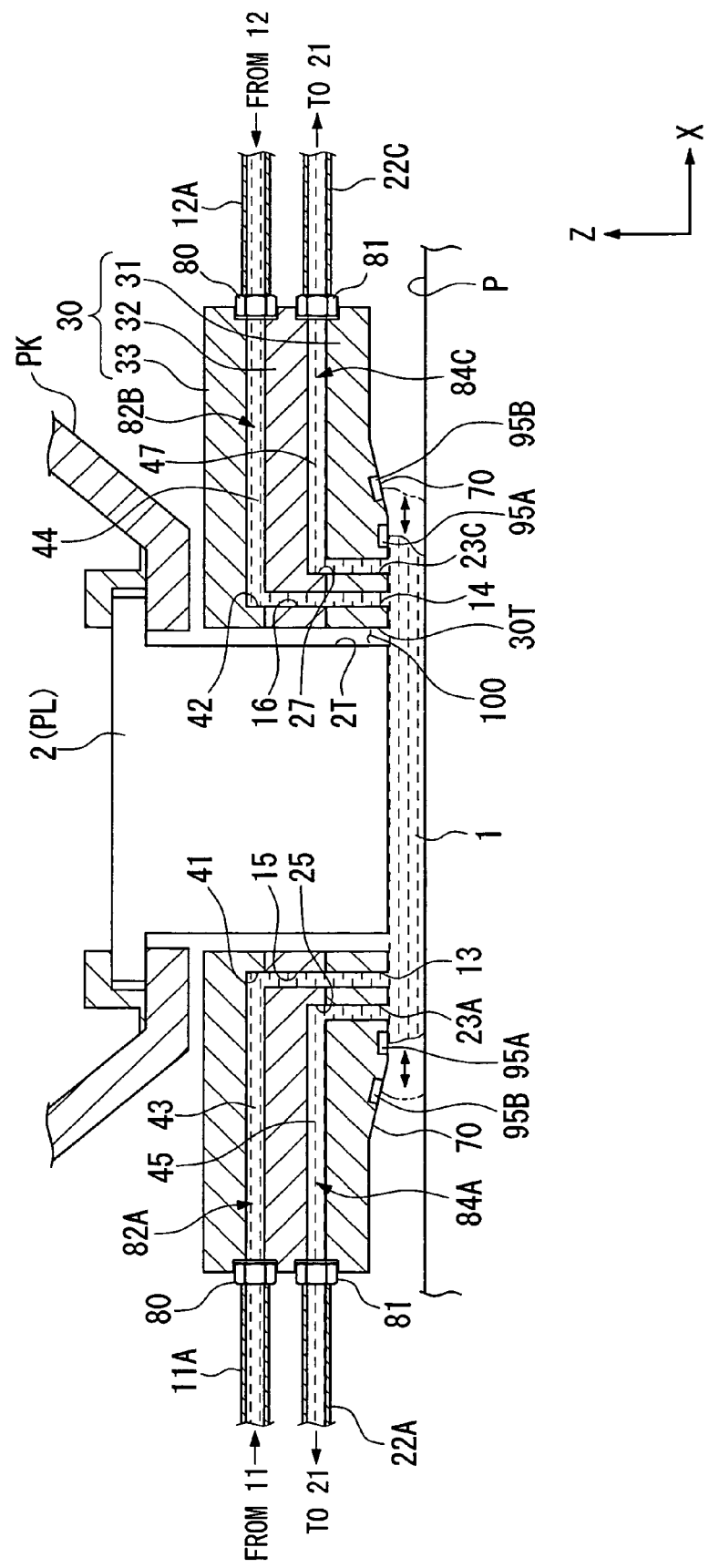
FIG. 15 is enlarged sectional view showing a principal part of a fifth embodiment of an exposure apparatus of the present invention.

The following explains a fifth embodiment of the present invention referring to FIG. 15. In this embodiment, particularly, in order to recover only the liquid 1 through the recovery ports 23, at least one of the quantity of liquid supplied through the first and second supply ports 13, 14, and the quantity of liquid recovered through the recovery ports 23 is controlled.

As shown in FIG. 15, in order to recover only the liquid 1 through the recovery ports 23, the controller CONT controls at least one of the quantity of liquid supplied by the liquid supply device 10 and the quantity of liquid recovered by the liquid recovery device 20. In this embodiment, the controller CONT keeps the quantity of liquid supplied constant while monitoring the measurement results of the flow meters 17, 18 and 24. At the same time, the controller CONT controls the quantity of liquid recovered. Thus, the controller CONT adjusts so that only the liquid 1 is recovered through the recovery ports 23. That is, in this embodiment, the liquid immersion area AR2 is formed so that the recovery ports 23 (23A-23D) are covered with the liquid 1, and only the liquid 1 is recovered through the recovery ports 23. As described above, if the liquid 1 is recovered with the surrounding gas through the recovery port 23, the liquid 1 flows into the recovery passage 84 intermittently, and the liquid droplets hit the inside wall of the recovery passage and the recovery tube. This causes the occurrence of vibration or the like. Therefore, it is possible to prevent vibration by recovering only the liquid 1 through the recovery ports 23.

When the controller CONT controls the quantity of liquid recovered while keeping the quantity of liquid supplied constant, the controller CONT controls the quantity of liquid recovered by the liquid recovery device 20 based on the measurement results of the flow meter 24. If the liquid 1 is recovered with the surrounding gas, the quantity of liquid recovered which is measured by the flow meter 24 is small as compared with the case where only the liquid 1 is recovered. The controller CONT adjusts the quantity of liquid recovered based on the measurement results of the flow meter 24. Specially, when the measurement value goes down, the controller CONT deems that the quantity of gas recovered with the liquid has increased. Then, the controller CONT controls so as to increase the quantity (liquid volume) of liquid in the liquid immersion area AR2 by reducing the quantity of liquid recovered (capacity of the liquid recovery section 21).

It is note that, as described above, only the quantity of liquid recovered by the liquid recovery device 20 is controlled. The controller CONT may control so that only the liquid 1 is recovered through the recovery ports 23 by controlling the quantity of liquid supplied by the liquid supply device 10, and also the controller CONT may control both the quantity of liquid supplied by the liquid supply device 10 and the quantity of liquid recovered by the liquid recovery device 20. In the case where the quantity of liquid supplied by the liquid supply device 10 is controlled, it is possible to preferably adjust the quantity of liquid in the liquid immersion area AR2 by controlling the quantity of liquid supplied based on the measurement results of the flow meters 17 and 18 which measure the quantity of liquid supplied.

Further, the substrate P faces the projection optical system PL by delivering the substrate P onto the substrate stage PST, and then the controller CONT starts supplying the liquid by driving the liquid supply device 10 in order to form the liquid immersion area AR2. At this time, the quantity of liquid supplied which is required for covering the recovery ports 23 with the liquid in the liquid immersion area AR2, in other words, information relating to a sufficient volume of the liquid in the liquid immersion area AR2 for covering the recovery ports 23 is previously calculated through experiment or simulation. The controller CONT performs liquid supply operation while monitoring the measurement results of the flow meters 17 and 18 relating to a quantity of liquid supplied based on the information. Therefore, it is possible to prevent the liquid from being suctioned with surrounding gas during the liquid recovery.

Alternatively, as shown in FIG. 15, liquid sensors 95A and 95B which can detect the edge of the liquid immersion area AR2 formed between the projection optical system PL and the substrate P may be disposed outside the recovery ports 23 on the lower surface (surface facing the substrate P) of the passage forming member 30. The controller CONT may control at least one of the quantity of liquid supplied through the first and second supply ports 13 and 14, and the quantity of liquid recovered through the recovery ports 23 so that the edge of the liquid immersion area AR2 exists in a predetermined area of the outside of the recovery ports 23, based on the measurement results of the liquid sensors 95A and 95B. The liquid sensors 95A and 95B detect the presence or absence of liquid by emitting a detecting beam, for example, downward (to the substrate P side). The reflected light condition of the detecting beam changes depending on the presence or absence of liquid under the liquid sensor 95A (95B). Consequently, it is possible to detect the presence or absence of liquid (that is, the edge of the liquid immersion area AR2) under the liquid sensor 95A (95B) by receiving the reflected light of the detecting beam.

Of the liquid sensors 95A and 95B, the liquid sensor 95A is disposed in the vicinity of the recovery ports 23, the liquid sensor 95B is disposed outside the liquid sensor 95A so as to be further from the projection area AR1 than the liquid sensor 95A. It is note that the two liquid sensors 95A and 95B are arranged so as to correspond to each of the four recovery ports 23A-23D. The measurement results of the liquid sensors 95A and 95B are outputted to the controller CONT, and the controller CONT controls at least one of the quantity of liquid supplied and the quantity of liquid recovered so that the edge of the liquid immersion area AR2 is placed between the liquid sensors 95A and 95B. If the edge of the liquid immersion area AR2 is closer to the projection area AR1 than the liquid sensor 95A, the liquid 1 is suctioned with surrounding gas through the recovery ports 23 during recovery of the liquid 1. In contrast, if the edge of the liquid immersion area AR2 is outside the liquid sensor 95A, there is a possibility of flowing out of the liquid 1 of the liquid immersion area AR2. The controller CONT forms the liquid immersion area AR2 so as to cover the recovery ports 23 (23A-23D) with the liquid 1, by controlling at least one of the quantity of liquid supplied and the quantity of liquid recovered so that the edge of the liquid immersion area AR2 is placed between the liquid sensors 95A and 95B. Therefore, it is possible to prevent the occurrence of flowing out of the liquid and vibration caused by suctioning of the liquid with the surrounding gas, and thus it is possible to form the liquid immersion area AR2 desirably.

In this embodiment, the liquid 1 is constituted by purified water. Purified water is available in large quantities in a semiconductor manufacturing factory or the like, and has the advantage of being able to reduce adverse affects for a photoresist on the substrate P, optical elements (lenses) and the like. Further, since purified water does not adversely affect the environment, and contains scarcely any impurities, it is possible to expect the added effect of cleaning of the surface of the substrate P and a surface of the optical element disposed on the end surface of the projection optical system PL.

It is said that the refractive index of purified water (water) relative to exposure light EL having a wavelength of about 193 nm is approximately 1.44. In a case where an ArF excimer laser light (having 163 nm wavelength) is used as the light source of the exposure light EL, since the wavelength of the light on the substrate P is shortened as multiplied by 1/n (that is, approximately 134 nm), high resolution can be obtained. Further, since the depth of focus is increased approximately n times (that is, approximately 1.44 times), if a depth of focus which is equal to that in air is just secured, it is possible to increase the numerical aperture of the projection optical system PL, and thus the resolution is also improved from this standpoint.

In this embodiment, the optical element 2 is attached at the end of the projection optical system PL. By using this lens, it is possible to adjust optical properties of the projection optical system PL, for example, aberration (spherical aberration, comatic aberration). It is note that the optical element attached at the end of the projection optical system PL may be an optical plate for adjusting the optical properties of the projection optical system PL. Further, it may be a parallel flat plate through which the exposure light EL can transmit.

It is note that in a case where the pressure between the optical element disposed at the end of the projection optical system PL and the substrate P which is caused by flowing of the liquid 1 is high, the optical element may be reliably fixed so that the optical element does not move due to the pressure, instead of making the optical element replaceable.

It is note that, in this embodiment, the liquid 1 is provided between the projection optical system PL and the surface of the substrate P. However, the liquid 1 may be provided between the projection optical system PL and a cover glass which is made of a parallel flat plate and which is attached to the surface of the substrate P.

It is note that, in this embodiment, water is used as the liquid 1. However, it may be a liquid other than water. For example, when the light source of the exposure light EL is an $F_2$ laser, the $F_2$ laser does not transmit through water. Accordingly, as the liquid 1, a fluorinated fluid through which $F_2$ laser can transmit, such as fluorinated oil, or perfluoropolyether (PFPE) may be used. Further, as the liquid 1, a material (for example, cedar oil) through which the exposure light EL transmits, of which the refractive index is as high as practicable, and which is stable when used with the projection optical system PL and the photoresist coated on the substrate P may be also used. In this case, the surface processing is performed corresponding to the liquid 1.

It is note that the substrate P of each of the embodiments described above not only can be a semiconductor wafer for manufacturing a semiconductor device, but also a glass substrate for a display device, a ceramic wafer for a thin film magnetic head, a master mask or reticle (synthetic quartz or silicon wafer), etc.

As the exposure apparatus EX, instead of a scanning type exposure apparatus (scanning stepper) in which the pattern of the mask M is scan-exposed while synchronously moving the mask M and the substrate P, a step-and-repeat type projection exposure apparatus (stepper) which exposes the full pattern of the mask M in the state where the mask M and substrate P are stationary, and the substrate P is successively moved stepwise can be used. Also, the present invention can be applied to a step-and-stitch type exposure apparatus in which at least two patterns are transferred onto the substrate P in a partially overlapping manner.

Further, as disclosed in Japanese Unexamined Patent Application, First Publication No. H10-163099, Japanese Unexamined Patent Application, First Publication No. H10-214783 (corresponding U.S. Pat. No. 6,341,007, U.S. Pat. No. 6,400,441, U.S. Pat. No. 6,549,269, and U.S. Pat. No. 6,590,634), and Published Japanese Translation No. 2000-505958 the PCT International Publication (corresponding U.S. Pat. No. 5,969,441), the present invention can be applied to a twin stage type exposure apparatus including two stages on which substrates to process such as wafers are separately mounted, and which are independently movable along the X and Y directions.

As for the type of exposure apparatus EX, the present invention is not limited to an exposure apparatus which exposes a semiconductor pattern onto the substrate P, for manufacturing semiconductor devices, but can also be applied to a variety of exposure apparatuses, for example, an exposure apparatus for manufacturing liquid crystal display devices or displays, an exposure apparatus for manufacturing thin film magnetic heads, an exposure apparatus for manufacturing image capture elements (CCD), and an exposure apparatus for manufacturing reticles or masks.

When using a linear motor (refer to U.S. Pat. No. 5,623,853 or U.S. Pat. No. 5,528,118) in a substrate stage PST or mask stage MST, either an air-cushion type linear motor using an air bearing or a magnetic levitation type linear motor using Lorentz force or reactance force may be used. Further, the substrate stage PST and mask stage MST may be either of a type moving along a guide or of a guideless type having no guide.

As the driving mechanism for the substrate stage PST and the mask stage MST, a planar motor which opposes a magnet unit in which magnets are two-dimensionally arranged on an armature unit in which coils are two-dimensionally arranged, and which drives the substrate stage PST or the mask stage MST using electromagnetic force may be used. In this case, either the magnet unit or the armature unit is attached to the stage PST or the stage MST, and the other unit is attached to the moving surface side of the stage PST or the stage MST.

As described in Japanese Unexamined Patent Application, First Publication No. H08-166475 (U.S. Pat. No. 5,528,118), a reaction force generated by the movement of the substrate stage PST may be mechanically released to the floor (earth) by use of a frame member so that the reaction force does not transmit to the projection optical system PL. As described in Japanese Unexamined Patent Application, First Publication No. H08-330224 (corresponding U.S. Pat. No. 5,874,820), a reaction force generated by the movement of the mask stage MST may be mechanically released to the floor (earth) by use of a frame member so that the reaction force does not transmit to the projection optical system PL.

The exposure apparatus EX of the embodiment is built by assembling various subsystems, including each element listed in the claims of the present application, in such a manner that prescribed mechanical accuracy, electrical accuracy, and optical accuracy are maintained. In order to ensure the various accuracies, prior to and after assembly, every optical system is adjusted to achieve its optical accuracy, every mechanical system is adjusted to achieve its mechanical accuracy, and every electrical system is adjusted to achieve its electrical accuracy.

The process of assembling each subsystem in the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which temperature, air purity, etc. are controlled.

Figure 16:
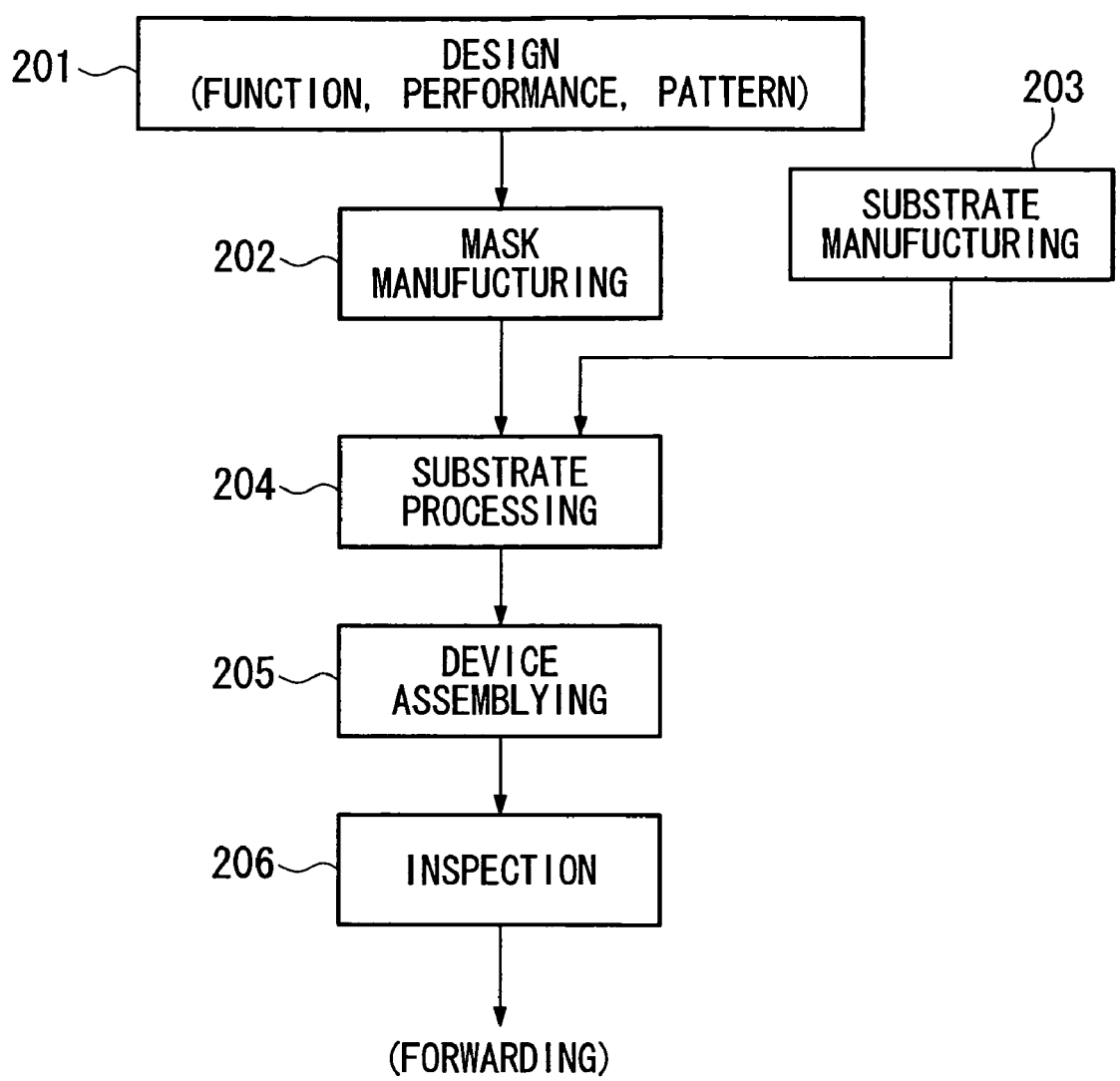
FIG. 16 is flow chart showing an example of a manufacturing process of semiconductor devices.

As shown in FIG. 16, micro-devices such as semiconductor devices are manufactured in a series of steps, including: step 201 in which the micro-device's function and performance design is performed; step 202 in which a mask (reticle) is manufactured based on the design step; step 203 in which a substrate, the device's base material, is manufactured; substrate processing step 204 in which the mask pattern is exposed onto the substrate by the exposure apparatus EX according to the above-described embodiments; device assembly step 205 (including a dicing process, bonding process, and packaging process); and inspection step 206.

While preferred embodiments of the invention have been described and illustrated above, it should be understood that these are exemplary of the invention and are not to be considered limiting. Additions, omissions, substitutions, and other modifications can be made without departing from the spirit or scope of the present invention. Accordingly, the invention is not to be considered as being limited by the foregoing description, and is only limited by the scope of the appended claims.

The present invention relates to an exposure apparatus which exposes a substrate by projecting a pattern image onto the substrate via a projection optical system and a liquid, including: a liquid supply device which has a supply port disposed in the vicinity of a projection area onto which the pattern image is projected, and which supplies the liquid onto the substrate from above the substrate through the supply port; and a liquid recovery device which has a first recovery port disposed further from the projection area than the supply port and a second recovery port disposed still further from the projection area than the first recovery port, and which recovers the liquid on the substrate from above the substrate through the first recovery port and the second recovery port.

The present invention relates to an exposure apparatus which exposes a substrate by projecting a pattern image onto the substrate via a projection optical system and a liquid, including a liquid recovery device which has a recovery port disposed above the substrate, and which recovers the liquid on the substrate from above the substrate through the recovery port, wherein a porous member is disposed inside the recovery port.

The present invention relates to an exposure apparatus which exposes a substrate by projecting a pattern image onto the substrate via a projection optical system and a liquid, including a liquid recovery device which has a recovery port disposed above the substrate, and which recovers the liquid on the substrate from above the substrate through the recovery port, wherein a capillary tube member is disposed inside the recovery port.

The present invention relates to an exposure apparatus which exposes a substrate by projecting a pattern image onto the substrate via a projection optical system and a liquid, including: a liquid supply device which has a supply port disposed in the vicinity of a projection area onto which the pattern image is projected, and which supplies the liquid onto the substrate from above the substrate through the supply port; a liquid recovery device which has a recovery port disposed so as to surround the projection area and the supply port, and which recovers the liquid on the substrate from above the substrate through the recovery port; and a control system which controls at least one of the quantity of the liquid supplied through the supply port and the quantity of the liquid recovered through the recovery port, so that only the liquid is recovered through the recovery port.

The present invention relates to an exposure apparatus which exposes a substrate by irradiating an exposure light to the substrate via a liquid which forms a liquid immersion area and a projection optical system, along with forming an immersion area at one part of the top of the substrate, including a detecting device which detects an end portion of the liquid immersion area.

The present invention relates to a device manufacturing method using the exposure apparatus described above.

What is claimed is:

1. An exposure apparatus which forms a liquid immersion area at one part on a substrate, and which exposes the substrate by irradiating an exposure light to the substrate via liquid which forms the liquid immersion area, comprising:
    a projection optical system via which the substrate is irradiated by the exposure light;
    a liquid supply device having a liquid supply port, which supplies the liquid for forming the liquid immersion area that covers only a portion of a surface of the substrate during exposure of the substrate; and
    a detecting device which detects an outer boundary of the liquid immersion area in plan view, wherein
    the detecting device includes at least one pair of sensors including a first sensor and a second sensor,
    the first sensor is disposed at a position closer to an optical axis of the exposure apparatus than the second sensor, and
    the detecting device is configured to detect the liquid between the first sensor and the second sensor on an outer side of the liquid immersion area with respect to the optical axis of the exposure apparatus.

2. The exposure apparatus according to claim 1, further comprising:
    a liquid recovery device which has a recovery port and recovers liquid on the substrate during the exposure, wherein
    at least one of a quantity of the liquid supplied by the liquid supply device and a quantity of the liquid recovered by the liquid recovery device is controlled based on the measurement result of the detecting device.

3. A device manufacturing method, the method comprising:
    exposing a substrate with the exposure apparatus according to claim 1; and
    processing the exposed substrate to form the device.

4. A manufacturing method which forms a liquid immersion area at one part on a substrate, and which exposes the substrate by irradiating an exposure light to the substrate via liquid which forms the liquid immersion area, comprising:
    irradiating the substrate with the exposure light via a projection optical system;
    supplying a liquid via a liquid supply device having a liquid supply port, which supplies the liquid for forming the liquid immersion area that covers only a portion of a surface of the substrate during exposure of the substrate; and detecting an outer boundary of the liquid immersion area in plan view with a detecting device, wherein the detecting device includes at least a pair of sensors including a first sensor and a second sensor, the first sensor is disposed at a position closer to an optical axis of the exposure apparatus than the second sensor, and the detecting device is configured to detect the liquid between the first sensor and the second sensor on an outer side of the liquid immersion area with respect to the optical axis of the exposure apparatus.

5. The manufacturing method according to claim 4, further comprising:

recovering the liquid via a liquid recovery device which has a recovery port and recovers liquid on the substrate during the exposure, wherein controlling at least one of a quantity of the liquid supplied by the liquid supply device and a quantity of the liquid recovered by the liquid recovery device is based on the measurement result of the detecting device.

* * * * *